US 9,165,803 B2

(12) United States Patent
Furutani et al.

(10) Patent No.: US 9,165,803 B2
(45) Date of Patent: Oct. 20, 2015

(54) BONDING METHOD, BONDING APPARATUS AND BONDING SYSTEM

(71) Applicant: Tokyo Electron Limited, Tokyo (JP)

(72) Inventors: Goro Furutani, Kumamoto (JP); Norio Wada, Kumamoto (JP); Satoshi Ookawa, Kumamoto (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 14/254,966

(22) Filed: Apr. 17, 2014

(65) Prior Publication Data

US 2014/0329341 A1    Nov. 6, 2014

(30) Foreign Application Priority Data

May 1, 2013    (JP) .................................. 2013-096605

(51) Int. Cl.
*H01L 21/46*    (2006.01)
*H01L 21/67*    (2006.01)

(52) U.S. Cl.
CPC .... *H01L 21/67092* (2013.01); *H01L 21/67103* (2013.01); *H01L 21/67109* (2013.01); *H01L 21/67248* (2013.01); *Y10T 156/1744* (2015.01)

(58) Field of Classification Search
CPC ................. H01L 21/67011; H01L 2224/4824; H01L 21/67103; Y10T 156/1744
USPC ................................... 438/799; 219/633, 243
See application file for complete search history.

(56) References Cited

U.S. PATENT DOCUMENTS

| | | | | |
|---|---|---|---|---|
| 6,153,524 A | * | 11/2000 | Henley et al. | 438/691 |
| 2005/0061856 A1 | * | 3/2005 | Maki et al. | 228/234.1 |
| 2006/0154443 A1 | * | 7/2006 | Horning | 438/455 |
| 2007/0246450 A1 | * | 10/2007 | Cady et al. | 219/250 |
| 2012/0107995 A1 | * | 5/2012 | Niiyama et al. | 438/64 |
| 2013/0199730 A1 | * | 8/2013 | Gudeman et al. | 156/379.6 |

FOREIGN PATENT DOCUMENTS

WO    2010-055730 A    5/2010

* cited by examiner

*Primary Examiner* — Caridad Everhart
(74) *Attorney, Agent, or Firm* — Abelman, Frayne & Schwab

(57) ABSTRACT

A bonding method according to an exemplary embodiment of the present disclosure includes a first holding processing, a second holding processing, a temporary bonding processing, a temperature increasing processing and a main bonding processing. In the first holding processing, a target substrate is held. In the second holding processing, a glass substrate held by electrostatic adsorption. In the temporary bonding processing, the target substrate and the glass substrate are temporarily bonded with a pressing force lower than a predetermined pressing force at a temperature lower than a predetermined temperature. In the temperature increasing processing, while releasing the electrostatic adsorption of the glass substrate at the same time as or after the temporary bonding, the temperature is increased to the predetermined temperature. In the main bonding processing, a main bonding of the target substrate and the glass substrate is performed with the predetermined pressing force.

13 Claims, 11 Drawing Sheets

BONDING METHOD, BONDING APPARATUS AND BONDING SYSTEM

CROSS-REFERENCE TO RELATED APPLICATIONS

This application is based on and claims priority from Japanese Patent Application No. 2013-096605, filed on May 1, 2013 with the Japan Patent Office, the disclosures of which is incorporated herein in its entirety by reference.

TECHNICAL FIELD

The present disclosure relates to a bonding method, a bonding apparatus and a bonding system.

BACKGROUND

In a manufacturing process of a semiconductor device, semiconductor substrates such as silicon wafers or compound semiconductor substrates have become larger in diameter and thinner in thickness. When a thin semiconductor substrate with a large diameter is transferred or subjected to a polishing process, there is a concern that a warpage or a crack may occur in the substrate. Therefore, target substrates have been reinforced by bonding support substrates such as glass substrates to the target substrates.

For example, International Publication WO2010/055730 discloses a method for bonding a target substrate and a glass substrate in which the target substrate and the glass substrate are held by an upper chuck and a lower chuck, respectively, and the upper chuck and the lower chuck are brought into close proximity with each other to press the target substrate and the glass substrate. An adhesive is then applied on the surface of the target substrate or the support substrate such that both of the substrates are bonded by being pressed as described above.

Further, International Publication WO2010/055730 discloses a method for bonding a target substrate and a glass substrate in which heating mechanisms are provided in an upper chuck and a lower chuck and the target substrate and the support substrate are heated.

SUMMARY

A bonding apparatus according to an exemplary embodiment of the present disclosure includes a first holding processing, a second holding processing, a temporary bonding processing, a temperature increasing processing and a main bonding processing. In the first holding processing, a target substrate is held. In the second holding processing, a glass substrate held by electrostatic adsorption. In the temporary bonding processing, after the holding of the target substrate and the glass substrate, the target substrate and the glass substrate are temporarily bonded with a pressing force lower than a predetermined pressing force at a temperature lower than a predetermined temperature. In the temperature increasing processing, while releasing the electrostatic adsorption of the glass substrate at the same time as or after the temporary bonding, the temperature is increased to the predetermined temperature. In the main bonding processing, after the increasing temperature, a main bonding of the target substrate and the glass substrate is performed with the predetermined pressing force.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
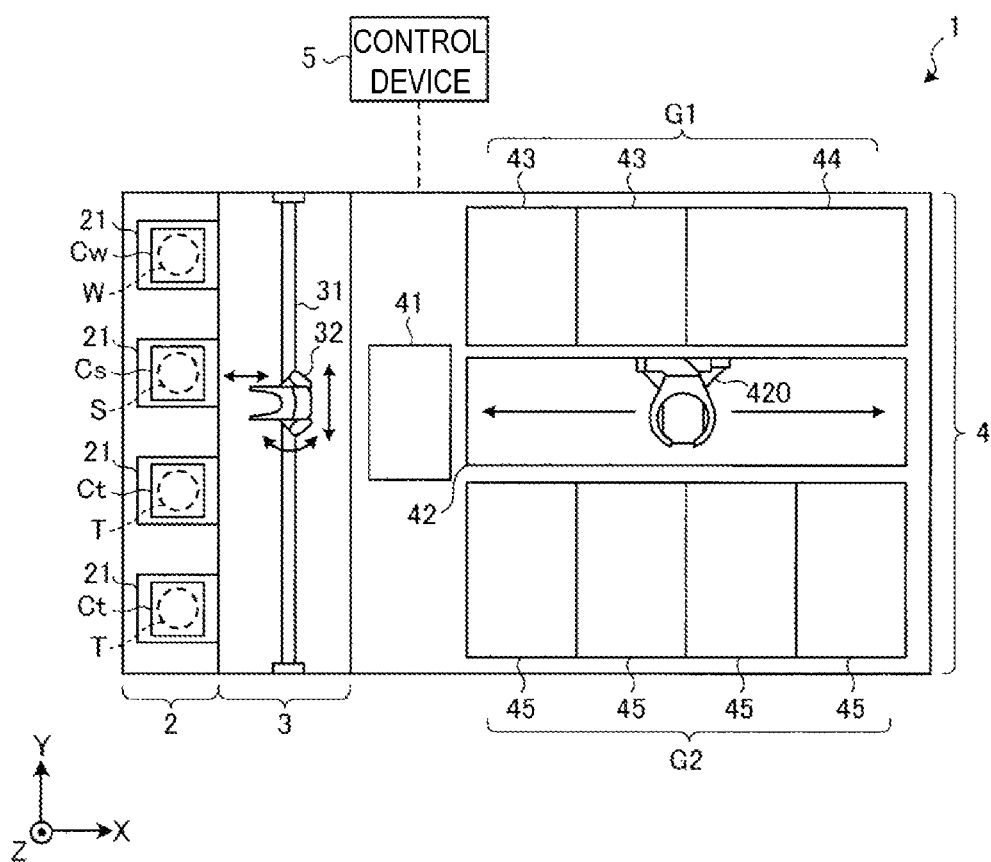
FIG. 1 is a schematic plan view illustrating the configuration of a bonding system according to the present exemplary embodiment.

In the following detailed description, reference is made to the accompanying drawings, which form a part hereof. The illustrative embodiments described in the detailed description, drawing, and claims are not meant to be limiting. Other embodiments may be utilized, and other changes may be made, without departing from the spirit or scope of the subject matter presented here.

In the prior art as described above, if an electrostatic chuck is employed as a holding unit of the glass substrate, sodium may be precipitated, and thus, surface deterioration of the second holding unit or deformation of the glass substrate may occur.

An object of the present disclosure is to provide a bonding method, a bonding apparatus and a bonding system, which can suppress sodium precipitation.

According to an aspect, the present disclosure provides a bonding method including holding a target substrate; holding a glass substrate by electrostatic adsorption; after the holding of the target substrate and the glass substrate, temporarily bonding the target substrate and the glass substrate with a pressing force lower than a predetermined pressing force at a temperature lower than a predetermined temperature; while releasing the electrostatic adsorption of the glass substrate at the same time as or after the temporarily bonding, increasing the temperature to the predetermined temperature; and after the increasing temperature, performing a main bonding of the target substrate and the glass substrate with the predetermined pressing force.

The above-mentioned bonding method further includes, after the holding of the target substrate and the glass substrate, and before the temporary bonding, decompressing an inside of a chamber accommodating the target substrate and the glass substrate.

The above-mentioned bonding method further includes cooling the target substrate after the main bonding by a first cooling mechanism provided at an opposite side to a holding surface of a first holding unit holding the target substrate and configured to cool the target substrate through the first holding unit; and cooling the glass substrate after the main bonding by a second cooling mechanism provided at an opposite side to a holding surface of a second holding unit holding the glass substrate and configured to cool the glass substrate through the second holding unit. Further, the increasing temperature includes: heating the target substrate by a first heating mechanism provided in the first holding unit; heating the glass substrate by a second heating mechanism provided in the second holding unit; heating the first cooling mechanism by a third heating mechanism provided on a surface of the first cooling mechanism opposite to the surface on which the first holding unit is disposed and configured to heat the first cooling mechanism; and heating the second cooling mechanism by a fourth heating mechanism provided on a surface of the second cooling mechanism opposite to the surface on which the second holding unit is disposed and configured to heat the second cooling mechanism.

The above-mentioned bonding method further includes detecting the temperature of the target substrate or the glass substrate in the temperature increasing; detecting the first cooling mechanism or the second cooling mechanism in the temperature increasing; and if a difference between the temperature of the target substrate or the glass substrate and the temperature of the first cooling mechanism or the second cooling mechanism is more than a threshold, stopping heating by the first heating mechanism, the second heating mechanism, the third heating mechanism and the fourth heating mechanism.

In the above-mentioned bonding method, the temperature lower than the predetermined temperature equals to or lower than a glass transition temperature of the glass substrate, and the predetermined temperature equals to or higher than the glass transition temperature.

According to another aspect, the present disclosure provides a bonding apparatus including a first holding unit provided with a first heating mechanism and configured to hold a target substrate; a second holding unit disposed facing the first holding unit, provided with a second heating mechanism and configured to hold a glass substrate; a pressing mechanism configured to relatively move the first holding unit and the second holding unit in order to contact and press the target substrate and the glass substrate; and a control unit configured to control the first holding unit, the second holding unit and the pressing mechanism. Further, the control unit controls the first holding unit, the second holding unit and the pressing mechanism so as to temporarily bond the target substrate and the glass substrate at a pressure lower than a predetermined pressure and a temperature lower than a predetermined temperature; release electrostatic adsorption of the glass substrate at the same time as or after the temporary bonding; after increasing the temperature to the predetermined temperature, perform a main bonding of the target substrate and the glass substrate at the predetermined pressure.

The above-mentioned bonding apparatus further includes a first cooling mechanism provided at an opposite side to a holding surface of the first holding unit and configured to cool the target substrate through the first holding unit; a second cooling mechanism provided at an opposite side to a holding surface of the second holding unit and configured to cool the glass substrate through the second holding unit; a third heating mechanism provided on a surface of the first cooling mechanism opposite to the surface on which the first holding unit is disposed and configured to heat the first cooling mechanism; and a fourth heating mechanism provided on a surface of the second cooling mechanism opposite to the surface on which the second holding unit is disposed and configured to heat the second cooling mechanism.

The above-mentioned bonding apparatus further includes a chamber configured to accommodate the first holding unit and the second holding unit; and a decompression mechanism configured to decompress the chamber.

According to another aspect, the present disclosure provides a bonding system including a carry-in/out station configured to place a target substrate and a glass substrate; a substrate transfer apparatus configured to transfer the target substrate and the glass substrate placed in the carry-in/out station; a bonding station provided with a bonding apparatus configured to bond the first substrate and the second substrate transferred by the substrate transfer apparatus; and a control unit configured to control the bonding apparatus. Further, the bonding apparatus includes a first holding unit provided with a first heating mechanism and configured to hold a first substrate; a second holding unit disposed facing the first holding unit, provided with a second heating mechanism and configured to hold a second substrate; and a pressing mechanism configured to relatively move the first holding unit and the second holding unit in order to contact and press the first substrate and the second substrate. Further, the control unit controls the first holding unit, the second holding unit and the pressing mechanism so as to temporarily bond the target substrate and the glass substrate at a pressure lower than a predetermined pressure and a temperature lower than a predetermined temperature; release electrostatic adsorption of the glass substrate at the same time as or after the temporary bonding; after increasing the temperature to the predetermined temperature, perform a main bonding of the target substrate and the glass substrate at the predetermined pressure.

With the features of the present disclosure, it is possible to suppress sodium precipitation from the glass substrate.

Hereinafter, exemplary embodiments of a bonding apparatus, a bonding system and a bonding method of the present disclosure will be described in detail with reference to the accompanying drawings. Further, it is noted that the present disclosure is not limited to the exemplary embodiments described below.

(First Exemplary Embodiment)

<1. Configuration of Bonding System>

Figure 2:
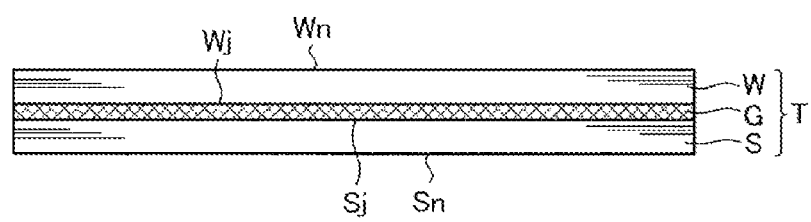
FIG. 2 is a schematic side view illustrating a target substrate and a glass substrate.

First, the configuration of a bonding system according to the present exemplary embodiment will be described with reference to FIGS. 1 and 2. FIG. 1 is a schematic plan view illustrating the configuration of the bonding system according to the present exemplary embodiment. In addition, FIG. 2 is a schematic side view illustrating a target substrate and a glass substrate. Meanwhile, in the following, in order to clarify positional relationships, each of the X-axis, Y-axis and Z-axis is defined to be directed as being orthogonal to each other, and the positive direction of the Z-axis is regarded as a vertically upward direction.

A bonding system 1 according to the present exemplary embodiment as illustrated in FIG. 1 bonds a target wafer W and a glass substrate S (see, e.g., FIG. 2) through an adhesive G to form a superposed substrate T.

Hereinafter, as illustrated in FIG. 2, among the surfaces of the target substrate W, the surface at the bonding side with the glass substrate S through the adhesive G is referred to as a "bonding surface Wj", and the surface at the opposite side to the bonding surface Wj is referred to as a "non-bonding surface Wn". In addition, among the surfaces of the glass substrate S, the surface at the bonding side with the target substrate W through the adhesive G is referred to as a "bonding surface Sj", and the surface at the opposite side to the bonding surface Sj is referred to as a "non-bonding surface Sn".

The target substrate W is, for example, a substrate having a plurality of electronic circuits formed on a semiconductor substrate such as a silicon wafer or a compound semiconductor wafer, and the surface at a side where electronic circuits are formed is regarded as the bonding surface Wj. After bonded with the glass substrate S, the target substrate W becomes thinner as the non-bonding surface Wn is subjected to polishing.

In the meantime, the glass substrate S serving as a support substrate has approximately the same diameter as that of the target substrate W, and supports the target substrate W. Further, a thermoplastic resin may be used for the adhesive G.

As illustrated in FIG. 1, the bonding system 1 is provided with a carry-in/out station 2, a first transfer region 3 and a bonding station 4. The carry-in/out station 2, the first transfer region 3 and the bonding station 4 are connected integrally in this order in the positive direction of the X-axis.

The carry-in/out station 2 is configured to place cassettes Cw, Cs, Ct accommodating a plurality (e.g., 25 sheets) of substrates horizontally. In the carry-in/out station 2, for example, four cassette placing tables 21 are provided side by side in a row. In each of the cassette placing tables 21, a cassette Cw configured to accommodate a target substrate W, a cassette Cs configured to accommodate a glass substrate S and a cassette Ct configured to accommodate a superposed substrate T are placed, respectively.

The number of the cassette placing tables 21 may be arbitrarily decided. Further, a case where cassettes Ct are placed on two of the four cassette placing tables 21 is exemplified herein, but, for example, a cassette for recovering a substrate in which a failure occurs may be placed on one of the four cassette placing tables 21.

In the first transfer region 3, a transfer passage 31 extending in the Y-axis direction and a first transfer device 32 movable along the transfer passage 31 are placed. The first transfer device 32 is also movable in the X-axis direction and rotatable around the Z-axis. The first transfer device 32 transfers a target substrate W, a glass substrate S and a superposed substrate T between the cassettes Cw, Cs, Ct placed on the cassette placing tables 21 and a first delivery unit 41 of the bonding station 4 as described below.

The bonding station 4 is provided with the first delivery unit 41 and a second delivery unit 42. In addition, the bonding station 4 is provided with an application and heat treatment block G1 and a bonding processing block G2.

The first delivery unit 41 is disposed between the first transfer region 3 and the second transfer region 42. In the first delivery unit 41, delivery of a target substrate W, a glass substrate S and a superposed substrate T is performed between the first transfer device 32 in the first transfer region 3 and a second transfer device 420 in the second transfer region 42 as described below.

The second transfer device 420 is disposed in the second transfer region 42. The second transfer device 420 is also movable in the X-axis direction and the Y-axis direction, and rotatable around the Z-axis. The second transfer device 420 transfers a target substrate W, a glass substrate S and a superposed substrate T between the first delivery unit 41, the application and heat treatment block G1 and the bonding processing block G2.

The application and heat treatment block G1 and the bonding processing block G2 are disposed facing each other across the second transfer region 42.

In the application and heat treatment block G1, two application apparatuses 43 and one heat treatment apparatus 44 are disposed adjacent to the second transfer region 42 side by side. Each of the application apparatuses 43 applies an adhesive G on the bonding surface Wj of the target substrate W, and the heat treatment apparatus 44 heats the target substrate W on which the adhesive G is applied to a predetermined temperature.

In the bonding processing block G2, four bonding apparatuses 45 are disposed adjacent to the second transfer region 42 side by side. Each of the bonding apparatuses 45 bonds a target substrate W and a glass substrate S. The configuration of the bonding apparatus 45 will be described in detail below.

Further, the bonding system 1 is provided with a control device 5. The control device 5 is, for example, a computer, and includes a control unit and a storage unit, which are not illustrated. The storage unit stores a program that controls various processings such as a bonding processing. The control unit controls the operations of the bonding system 1 by reading out and executing the program stored in the storage unit.

In the meantime, the program may be recorded in a recording medium readable by a computer, and installed from the recording medium to the storage unit of the control device 5. The recording medium readable by a computer may be, for example, a hard disc (HD), a flexible disc (FD), a compact disc (CD), a magnet optical disc (MO) or a memory card.

In the bonding system 1 configured as described above, the first transfer device 32 in the first transfer region 3 takes out a target substrate W first from the cassette Cw placed on the cassette placing table 21, and transfers the target substrate W taken from the cassette Cw to the first delivery unit 41. At that time, the target substrate W is transferred in a state where the non-bonding surface Wn is directed downwardly.

The target substrate W transferred to the first delivery unit 41 is extracted from the first delivery unit 41 and carried into the application apparatus 43 in the application and heat treatment block G1 by the second transfer device 420. The application apparatus 43 is provided with, for example, a spin chuck, and adsorbs and holds the non-bonding surface Wn of the target substrate W with the spin chuck. The application apparatus 43 then supplies a liquid adhesive G to the bonding surface Wj of the target substrate W while rotating the target substrate W which has been adsorbed and held.

After the adhesive G is applied by the application apparatus 43, the target substrate W is carried out from the application apparatus 43 and carried into the heat treatment apparatus 44 by the second transfer device 420. The heat treatment apparatus 44 heats the target substrate W in the inside which is maintained under, for example, an inert atmosphere to volatilize a solvent such as an organic solvent contained in the adhesive G such that the adhesive G becomes harder than when it is applied. Thereafter, the temperature of the target substrate W is adjusted to a predetermined temperature, for example, at room temperature.

After the heat treatment is performed by the heat treatment apparatus 44, the target substrate W is carried out from the heat treatment apparatus 44 and carried into the bonding apparatus 45 by the second transfer device 420.

In the meantime, the glass substrate S is taken out from the cassette Cs and transferred to the first delivery unit 41, and again, is taken out from the first deliver unit 41 and then transferred into the bonding apparatus 45.

When the target substrate W and the glass substrate S are carried into the bonding apparatus 45, a bonding processing of the target substrate W and the glass substrate S is performed by the bonding apparatus 45. As a result, a superposed substrate T is formed. Then, the superposed substrate T is transferred to the first delivery unit 41 by the second transfer device 420, and then transferred to the cassette Ct by the first transfer device 32. In this way, a series of processings are terminated.

<2. Configuration of Bonding Apparatus>

Figure 3:
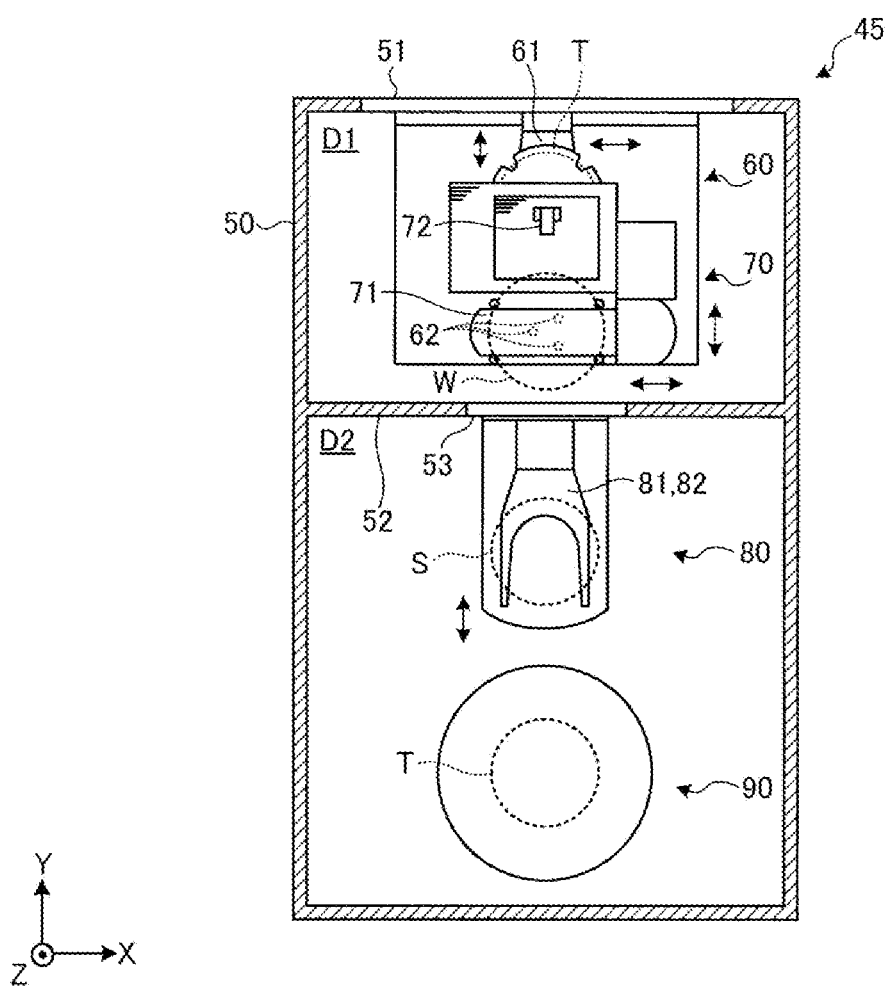
FIG. 3 is a schematic cross-sectional plan view illustrating the configuration of a bonding apparatus.

The configuration of the bonding apparatus 45 will be described with reference to FIG. 3. FIG. 3 is a schematic cross-sectional plan view illustrating the configuration of the bonding apparatus 45.

As illustrated in FIG. 3, the bonding apparatus 45 is provided with a processing chamber 50 of which the inside is sealable. At the second transfer region 42 side of the processing chamber 50, a carry-in/out port 51 is provided for a target substrate W, a glass substrate S and a superposed substrate T. The carry-in/out port 51 is provided with an opening/closing shutter (not illustrated).

Inside the processing chamber 50, an inner wall 52 may be provided to partition the region in the processing chamber 50 into a preprocessing region D1 and a boding region D2. In a case where an inner wall 52 is provided, the inner wall 52 is formed with a carry-in/out port 53 for a target substrate W, a glass substrate S and a superposed substrate T, and the carry-in/out port 53 is provided with an opening/closing shutter (not illustrated). Further, the carry-in/out port 51 described above is formed on the side of the processing chamber 50 in the preprocessing region D1.

In the preprocessing region D1, a delivery unit 60 is provided to deliver a target substrate W, a glass substrate S and a superposed substrate T with the outside of the bonding apparatus 45. The delivery unit 60 is disposed adjacent to the carry-in/out port 51.

The delivery unit 60 is provided with a delivery arm 61 and support pins 62. The delivery arm 61 performs the delivery of a target substrate W, a glass substrate S and a superposed substrate T between the second transfer device 420 (see, e.g., FIG. 1) and the support pins 62. The support pins 62 are provided at a plurality of sites (e.g., three sites) to support the target substrate W, the glass substrate S and the superposed substrate T.

Further, a multiple tiers (e.g., two tiers) of delivery units 60 may be disposed vertically to deliver any two of the target substrate W, the glass substrate S and the superposed substrate T at the same time. For example, one delivery unit 60 may deliver a target substrate W and a glass substrate S before bonding, and another delivery unit 60 may deliver a superposed substrate T after bonding.

At the negative direction side of the Y-axis of the preprocessing region D1, that is, at the carry-in/out port 53 side, an inversion unit 70 configured to invert, for example, the front surface of the target W is provided.

The inversion unit 70 is provided with a holding arm 71 configured to insert and hold a target substrate W or a glass substrate S. The holding arm 71 extends horizontally (in the X-axis direction in FIG. 3), and is pivotable around the horizontal axis as well as movable horizontally (in the X-axis direction and the Y-axis direction) and vertically (in the Z-axis direction).

Further, the inversion unit 70 also has an adjustment function to adjust the horizontal direction of the target substrate W or the glass substrate S. Specifically, the inversion unit 70 is provided with a detection unit 72 configured to detect the position of a notch of the glass substrate S or the target substrate W. And, in the inversion unit 70, by detecting the position of the notch in the detection unit 71 while moving the glass substrate S or the target substrate W held in the holding arm 71, the position of the notch is adjusted so as to adjust the horizontal direction of the target substrate W or the glass substrate S.

At the Y-axis positive direction of the bonding region D2, a transfer unit 80 is provided to transfer a target substrate W, a glass substrate S and a superposed substrate T with respect to the delivery unit 60, the inversion unit 70 and a bonding unit 90 to be described below. The transfer unit 80 is disposed adjacent to the carry-in/out port 53.

The transfer unit 80 is provided with two transfer arms 81, 82. The transfer arms 81, 82 are disposed vertically in two stages in this order from the bottom, and are movable horizontally and vertically by a driving unit (not illustrated).

Among the transfer arms 81, 82, the transfer arm 81 holds and transfers the rear surface, that is, the non-bonding surface Sn of, for example, the glass substrate S. Meanwhile, the transfer arm 82 holds and transfers the outer periphery of the front surface, that is, the bonding surface Wj of the target substrate W of which the front and rear surfaces are inverted in the inversion unit 70.

And, at the negative direction side of the Y-axis of the bonding region D2, a bonding unit 90 configured to bond the target substrate W and the glass substrate S is provided.

In the bonding apparatus 45 configured as described above, when the target substrate W is delivered to the delivery arm 61 of the delivery unit 60 by the second transfer device 420, the delivery arm 61 delivers the target substrate W to the support pins 62. Thereafter, the target substrate W is transferred from the support pins 62 to the inversion unit 70 by the transfer 81 of the transfer unit 80.

For the target substrate W transferred to the inversion unit 70, as the position of the notch is detected by the detection unit 72 of the inversion unit 70, the horizontal direction of the target substrate W is adjusted. Thereafter, the target substrate W is inverted by the inversion unit 70. That is, the bonding surface Wj is directed downwardly.

Subsequently, the target substrate W is transferred from the inversion unit 70 to the bonding unit 90 by the transfer arm 82 of the transfer unit 80. At this time, since the transfer arm 82 holds the outer periphery of the target substrate W, the bonding surface Wj may be suppressed from being contaminated and damaged by, for example, particles attached to the transfer arm 82.

In the meantime, when the glass substrate S is delivered to the delivery arm 61 of the delivery unit 60 by the second transfer device 420, the delivery arm 61 delivers the glass substrate S to the support pins 62. Thereafter, the glass substrate S is transferred from the support pins 62 to the inversion unit 70 by the transfer arm 81 of the transfer unit 80.

For the glass substrate S transferred to the inversion unit 70, as the position of the notch is detected by the detection unit 72 of the inversion unit 70, the horizontal direction of the glass substrate S is adjusted. Thereafter, the glass substrate S is transferred from the inversion unit 70 to the bonding unit 90 by the transfer arm 81 of the transfer unit 80.

When the carry-in operation of the target substrate W and the glass substrate S to the bonding unit 90 is terminated, the target substrate W and the glass substrate S are bonded to each other by the bonding unit 90 to form a superposed substrate T. The superposed substrate T formed as described above is transferred from the bonding unit 90 to the delivery unit 60 by the transfer arm 81 of the transfer unit 80, delivered to the delivery arm 61 via the support pins 62, and then, delivered from the delivery arm 61 to the second transfer device 420 again.

<3. Configuration of Bonding Unit>

Figure 4:
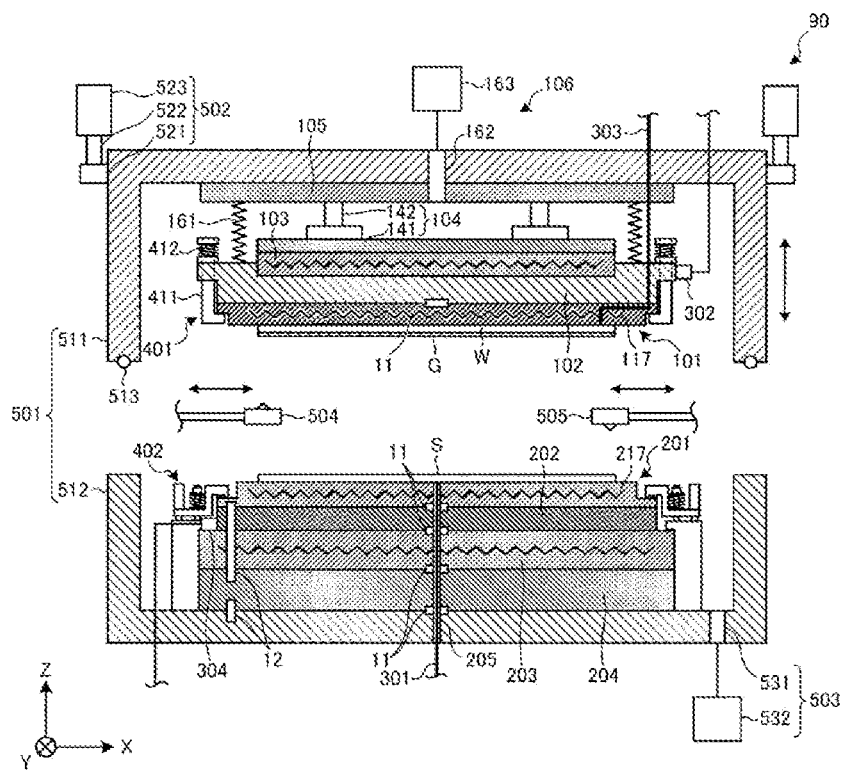
FIG. 4 is a schematic cross-sectional side view illustrating the configuration of the bonding unit.

The configuration of the bonding unit 90 will be described with reference to FIG. 4. FIG. 4 is a schematic cross-sectional side view illustrating the configuration of the bonding unit 90. In FIG. 4, only the components necessary to explain the characteristics of the bonding unit 90 are illustrated, and common components are omitted.

As illustrated in FIG. 4, the bonding unit 90 is provided with a first holding unit 101 and a second holding unit 201. The first holding unit 101 is disposed above the second holding unit 201 to hold the target substrate W. In addition, the second holding unit 201 holds the glass substrate S. The first holding unit 101 and the second holding unit 201 are substantially disc-shaped and have a diameter larger than those of the target substrate W and the glass substrate S.

Figure 5A:
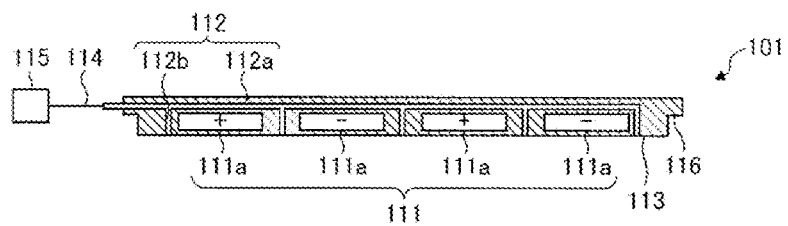
FIG. 5A is a schematic cross-sectional side view illustrating the configuration of a first holding unit.
Figure 5B:
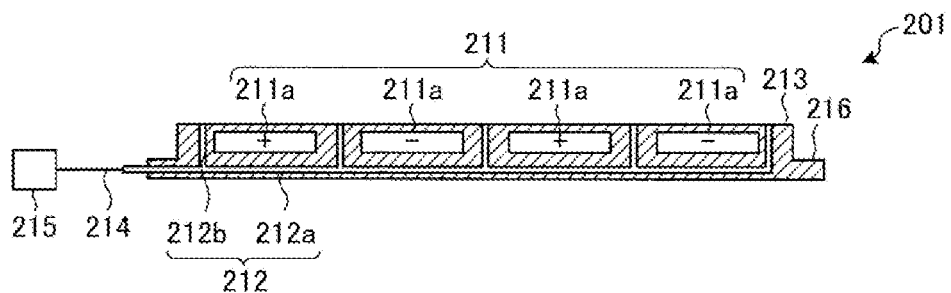
FIG. 5B is a schematic cross-sectional side view illustrating the configuration of a second holding unit.

The first holding unit 101 and the second holding unit 201 are electrostatic chucks and hold the target substrate W and the glass substrate S, respectively, by electrostatic adsorption. Here, the configurations of the first holding unit 101 and the second holding unit 201 will be described with reference to FIGS. 5A and 5B. FIG. 5A is a schematic cross-sectional side view illustrating the configuration of the first holding unit 101. FIG. 5B is a schematic cross-sectional side view illustrating the configuration of the second holding unit 201.

As illustrated in FIGS. 5A and 5B, the first holding unit 101 and the second holding unit 201 are provided with electrostatic adsorption units 111, 211, respectively.

Each of the electrostatic adsorption units 111, 211 is provided with a plurality of internal electrodes 111a, 211a, respectively, and adsorb the non-bonding surface Wn of the target substrate W and the non-bonding surface Sn of the glass substrate S, respectively, by using an electrostatic force generated on each of holding surfaces 113, 213 by the internal electrodes 111a, 211a.

As described above, since the bonding unit 90 uses electrostatic chucks as the first holding unit 101 and the second holding unit 201, the target substrate W and the glass substrate S may be securely held under a reduced pressure atmosphere.

That is, although a vacuum chuck configured to adsorb and hold using negative pressure may be considered as a holding unit, such a holding unit has a reduced adsorption force under a reduced pressure environment, and thus, there is a concern that the target substrate W and the glass substrate S may fall or misalignment occurs. In contrast, since the adsorption force of the electrostatic chuck is not reduced even under a vacuum environment, the target substrate W and the glass substrate S may be securely held.

Further, in a case where a mechanical chuck that performs mechanical holding is used as a holding unit, there is a concern that the target substrate W and the glass substrate S may be damaged. However, the electrostatic chuck hardly damages the target substrate W and the glass substrate S, as compared to the mechanical chuck.

Further, it may be considered that a vacuum chuck is used for the second holding unit 201 and a rubber pad is provided on its holding surface, thereby suppressing misalignment of the glass substrate S under a reduced pressure atmosphere. However, it is not possible to use a rubber pad in a case where a bonding processing is performed under a high temperature environment exceeding the heat-resistant as in the bonding unit 90 according to the present exemplary embodiment.

Accordingly, in the bonding unit 90 according to the present exemplary embodiment, electrostatic chucks may be used for both of the first holding unit 101 and the second holding unit 201. Further, the heat-resistant temperature of a fluorine rubber known for its high heat-resistance is 300° C. However, in the bonding system 1 according to the present exemplary embodiment, the bonding processing of the target substrate W and the glass substrate S is performed under a high temperature environment of 300° C. or higher.

As illustrated in FIGS. 5A and 5B, the first holding unit 101 and the second holding unit 201 are provided with vacuum adsorption units 112, 212, respectively, in addition to the electrostatic adsorption units 111, 211.

The vacuum adsorption units 112, 212 are provided with intake spaces 112a, 212a and a plurality of through-holes 112b, 212b in communication with the intake spaces 112a, 212a from the holding surfaces 113, 213.

The vacuum adsorption units 112, 212 use negative pressure generated by intake of intake devices 115, 215 to adsorb the non-bonding surface Wn of the target substrate W and the non-bonding surface Sn of the glass substrate S, respectively, thereby holding the target substrate W and the glass substrate S.

Meanwhile, the first holding unit 101 and the second holding unit 201 are formed of ceramics such as aluminum nitride.

Further, in the outer periphery of the first holding unit 101 and the second holding unit 201, steps 116, 216 dented in a thickness direction with respect to the holding surfaces 113, 213 are provided. The steps 116, 216 are provided with a first holding mechanism 401 and a second holding mechanism (see, e.g., FIG. 4).

The first holding mechanism 401 and the second holding mechanism 402 elastically hold the first holding unit 101 and the second holding unit 201, respectively. The first holding mechanism 401 and the second holding mechanism 402 will be described below.

Referring back to FIG. 4, descriptions will be continued on the first holding unit 101 and the second holding unit 201. Each of the first holding unit 101 and the second holding unit 201 is equipped with a first heating mechanism 117 and a second heating mechanism 217, respectively, built therein. The first heating mechanism 117 heats the target substrate W held by the first holding unit 101, and the second heating mechanism 217 heats the glass substrate S held by the second holding unit 201.

The bonding processing of the target substrate W and the glass substrate S is performed under a reduced pressure atmosphere. Therefore, the first heating mechanism 117 built in the first holding unit 101 may be a ceramic heater which is also available under a reduced pressure atmosphere.

Meanwhile, since the second holding unit 201 is formed with through-holes configured to insert a first temperature detection unit 301 (to be described below) therethrough, it is difficult to dispose a sheath heater. Therefore, a ceramic heater is used as the second heating mechanism 217 built in the second holding unit 201.

Further, the bonding unit 90 is provided with a first cooling mechanism 102, a third heating mechanism 103, pressing units 104, a base member 105 and a pressing mechanism 106.

The first cooling mechanism 102 is provided in contact with a surface opposite to the holding surface 113 (see, e.g., FIG. 5A) of the first holding unit 101. The first cooling mechanism 102 may be, for example, a cooling jacket made of metal, and cools the first holding unit 101 by using a cooling fluid such as cold water as a medium such that the target substrate W held in the first holding unit 101 is cooled.

The third heating mechanism 103 is formed with, for example, a disc shape having substantially the same diameter as that of the target substrate W. The third heating mechanism 103 is disposed on a surface of the first cooling mechanism 102 opposite to the surface on which the first holding unit 101 is disposed, and heats the first cooling mechanism 102. The third heating mechanism 103 may be a sheath heater which is also available under a reduced pressure atmosphere.

The pressing units 104 press the third heating mechanism 103 to the first cooling mechanism 102. Each of the pressing unit 104 is provided with a plate 141 and a support member 142. The plate 141 is disc-shaped metal member having substantially the same diameter as that of the third heating member 103, and is disposed on the top surface of the third heating mechanism 103. A plurality of support members 142 is stretchable vertically and disposed on the top surface of the plate 141 to suppress misalignment of the plate 141 and the third heating mechanism 103.

The pressing units 104 may press the third heating mechanism 103 to the first cooling mechanism 102 by the weight of the plates 141. Alternatively, biasing members such as coil spring may be provided inside the support members 142 so as to press the third heating mechanism 103 to the first cooling mechanism 102. As such, by pressing the third heating mechanism 103 to the first cooling mechanism 12 to bring the third heating mechanism 103 into close contact with the first cooling mechanism 102, it is possible to more securely suppress the first cooling mechanism 102 from being warped due to thermal deformation.

The base member 105 is attached to the top surface of the first chamber portion 511 (to be described below) above the pressing units 104. Further, the upper ends of the support members 142 are fixed to, for example, the bottom surface of the base member 105.

The pressing mechanism 106 moves the first holding unit 101 vertically downward to contact and press the target substrate W to the glass substrate S. The pressing mechanism 106 is provided with a pressure vessel 161, a gas supply pipe 162 and a gas supply source 163.

The pressure vessel 106 is constituted with a stainless steel bellows that can be stretchable vertically. The lower end of the pressure vessel 161 is fixed to the top surface of the first cooling mechanism 102, and the upper end is fixed to the lower surface of the base member 105. Further, the abovementioned third heating mechanism 103 and pressing units 104 are disposed inside the pressure vessel 161.

The gas supply pipe 162 is connected to the pressure vessel 161 through the base member 105 and a first chamber portion 511 (to be described below) at one end thereof, and connected to the gas supply source 163 at the other end thereof.

The pressure vessel 161 is stretched by gas supplied from the gas supply source 163 to the inside of the pressure vessel 161 through the gas supply so as to move down the first holding unit 101. Accordingly, the target substrate W is contacted and pressed to the glass substrate S. The pressing force of the target substrate W and the glass substrate S is adjusted by adjusting the pressure of the gas supplied to the pressure vessel 161.

Meanwhile, since the pressure vessel 161 has stretchability, even if there is a difference in parallelism between the first holding unit 101 and the second holding unit 201, the difference may be absorbed. Further, since the inside of the pressure vessel 161 is evenly pressed by gas, the target substrate W and the glass substrate S may be evenly pressed.

Further, the bonding unit 90 is provided with a second cooling mechanism 202, a fourth heating mechanism 203 and a spacer 204. The second cooling mechanism 202, the fourth heating mechanism 203 and the spacer 204 are laminated in the order of the spacer 204, the fourth heating mechanism 203, the second cooling mechanism 202 and the second holding unit 201 from the bottom.

The second cooling mechanism 202 is formed with, for example, a disc shape having substantially the same diameter as that of the second holding unit 201. The second cooling mechanism 202 is provided in contact with a surface opposite to the holding surface 213 (see FIG. 5B) of the second holding unit 201. Similarly to the first cooling mechanism 102, the second cooling mechanism 202 may be, for example, a cooling jacket made of metal, and cools the second holding unit 201 by using a cooling fluid such as cold water as a medium such that the glass substrate S held in the second holding unit 201 is cooled.

The fourth heating mechanism 203 is formed with, for example, a disc shape having a diameter larger than that of the second cooling mechanism 202. The fourth heating mechanism 203 is disposed on a surface of the second cooling mechanism 202 opposite to the surface on which the second holding unit 201 is disposed, and heats the second cooling mechanism 202. The fourth heating mechanism 203 may be a sheath heater for the same reason as in the first heating mechanism 117.

The spacer 204 is a member disposed on the bottom surface of the fourth heating mechanism 203, and is installed in order to adjust, for example, the height of the second holding unit 201. The spacer 204 is disposed on the bottom surface of the second chamber portion 512 to be described below. Further, the bonding unit 90 is not necessarily provided with the spacer 204.

As described above, in the bonding unit 90 according to the present exemplary embodiment, the first heating mechanism 117 and the third heating mechanism 103 are provided so as to sandwich the upper and lower surfaces of the first cooling mechanism 102 therebetween, and the second heating mechanism 217 and the fourth heating mechanism 203 are provided so as to sandwich the upper and lower surfaces of the second cooling mechanism 202 therebetween. As a result, the first cooling mechanism 102 and the second cooling mechanism 202 may be suppressed from being warped by heating, and the first holding unit 101 and the second holding unit 201 may be suppressed from being damaged by such warpage.

Figure 6A:
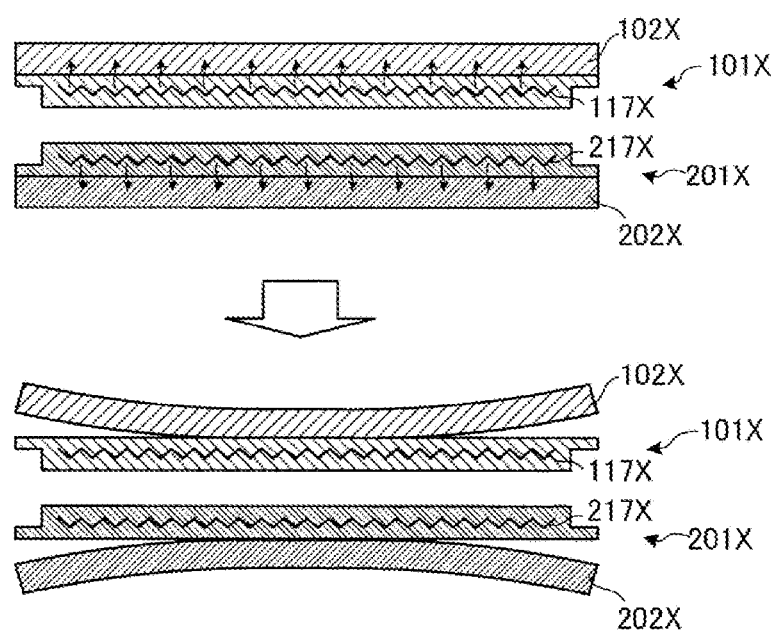
FIG. 6A is a view for describing a situation where a warpage occurs in a first cooling mechanism and a second mechanism in the related art.
Figure 6B:
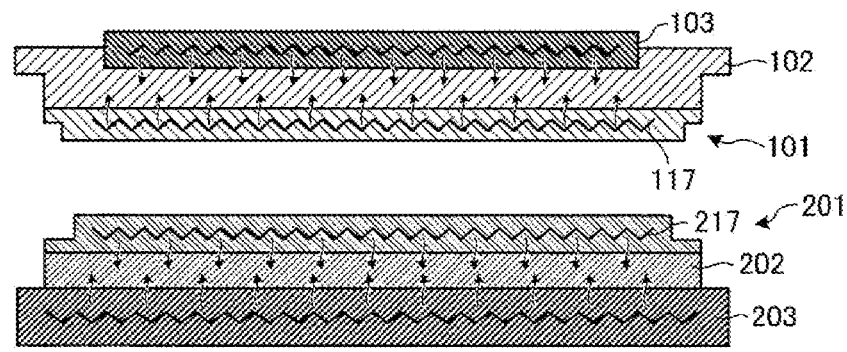
FIG. 6B is a schematic cross-sectional side view illustrating a first cooling mechanism and a second cooling mechanism according to the present exemplary embodiment.

In this regard, descriptions will be made with reference to FIGS. 6A and 6B. FIG. 6A is a view for describing a situation that warpage occurs in a first cooling mechanism and a second mechanism in the related art. FIG. 6B is a schematic cross-sectional side view illustrating the first cooling mechanism 102 and the second cooling mechanism 102 according to the present exemplary embodiment.

As illustrated in FIG. 6A, conventionally, a first heating mechanism 117X of a first holding unit 101X is provided below a first cooling mechanism 102X, and a second heating mechanism 217X of a second holding unit 201X is provided above a second cooling mechanism 202X.

Therefore, conventionally, when heating is performed by the first heating mechanism 117X and the second heating mechanism 217X, a temperature difference is likely to occur between the upper and lower surfaces of the first cooling mechanism 102X and the second cooling mechanism 202X.

Especially, when heating operation is performed under a reduced pressure atmosphere, since the thermal conductivity of the gas is decreased by the reduced pressure, a large temperature difference is likely to occur between a portion in contact with the gas and a portion not in contact with the gas, that is, a portion in contact with the first holding unit 101X and the second holding unit 201X and a portion not in contact with the first holding unit 101X and the second holding unit 201X.

As a result, warpage is likely to occur in the first cooling mechanism 102X and the second cooling mechanism 202X in the related art. The first holding unit 101X and the second holding unit 201X are formed of ceramics which has low toughness as compared to metal. Therefore, since stress caused by the warpage of the first cooling mechanism 102X and the second cooling mechanism 202X is applied to the first holding unit 101X and the second holding unit 201X, there is a concern that damages such as crack may occur in the first holding unit 101X and the second holding unit 201X.

Accordingly, in the bonding unit 90 according to the present exemplary embodiment, as illustrated in FIG. 3B, the third heating mechanism 103 is further provided on the top surface of the first cooling mechanism 102, and the fourth heating mechanism 203 is further provided on the lower surface of the second cooling mechanism 202.

As a result, since the temperature difference is suppressed from occurring between the upper and lower surfaces of the first cooling mechanism 102 and the second cooling mechanism 202, the first cooling mechanism 102 and the second cooling mechanism 202 may be suppressed from being warped. Therefore, by the bonding unit 90 according to the present exemplary embodiment, it is possible to suppress the first holding unit 101 and the second holding unit 201 from being damaged.

As illustrated in FIG. 4, the first holding unit 101 is provided with a first temperature detection unit 303 configured to detect a temperature of the target substrate W. Further, a second temperature detection unit 302 configured to detect a temperature of the first cooling mechanism 102 is attached to an outer periphery of the first cooling mechanism 102. For example, thermocouples may be used for the first temperature detection unit 303 and the second temperature detection unit 302.

The detection results of the first temperature detection unit 303 and the second temperature detection unit 302 are transmitted to a control device 5. Then, in a case where the control device 5 determines that warpage occurs in the first cooling mechanism 102 based on the detection result, the control device 5 executes a fail-safe processing which stops heating by the first heating mechanism 117 and the like.

Similarly, the second holding unit 201 is provided with a first temperature detection unit 301 configured to detect a temperature of the glass substrate W. A second temperature detection unit 304 configured to detect a temperature of the second cooling mechanism 202 is attached to an outer periphery of the second cooling mechanism 202. For example, thermocouples are used for the first temperature detection unit 301 and the second temperature detection unit 304.

The detection results of the first temperature detection unit 301 and the second temperature detection unit 304 are transmitted to a control device 5. Then, in a case where the control device 5 determines that warpage occurs in the second cooling mechanism 202 based on the detection result, the control device 5 also executes a fail-safe processing which stops heating by the first heating mechanism 117 and the like.

By providing such a fail-safe processing, even if warpage occurs in the first cooling mechanism 102 and the second cooling mechanism 202, it is possible to suppress further warpage from occurring, and thus, it is possible to suppress the first holding unit 101 and the second holding unit 201 from being damaged. Further, the fail-safe processing will be described below with reference to FIG. 13.

Further, as illustrated in FIG. 6A, the first cooling mechanism 102 and the second cooling mechanism 202 are likely to be warped in a direction away from the first holding unit 101 and the second holding unit 201. Therefore, as the warpage of the first cooling mechanism 102 and the second cooling mechanism 202 becomes larger, a difference will occur between the temperatures of the outer peripheries of the first cooling mechanism 102 and the second cooling mechanism 202 and the temperatures of the first holding unit 101 and the second holding unit 201.

Accordingly, by providing the second temperature detection units 302, 304 in the outer peripheries of the first cooling mechanism 102 and the second cooling mechanism 202, respectively, to detect the temperatures of the outer peripheries of the first cooling mechanism 102 and the second cooling mechanism 202, the warpage of the first cooling mechanism 102 and the second cooling mechanism 202 may be detected properly.

The present exemplary embodiment has been described with reference to an example in which the second temperature detection units 302, 304 are provided in both of the first cooling mechanism 102 and the second cooling mechanism 202. However, the second temperature detection units 302, 304 may be provided in any one of the first cooling mechanism 102 and the second cooling mechanism 202. Further, the first temperature detection units 301, 303 may also be provided in any one of the first cooling mechanism 102 and the second cooling mechanism 202.

The first holding mechanism 401 and the second holding mechanism 402 will be described hereinafter. The above-mentioned first holding unit 101 is centered to some extent by positioning pins 11 without being fixed to the first cooling mechanism 102 and, but is laminated with a predetermined room in a horizontal direction. If the first holding unit 101 and the first cooling mechanism 102 are completely fixed and thermal expansion occurs as the first holding unit 101 and the first cooling mechanism 102 are heated, there is a concern that the first holding unit 101 and the first cooling mechanism 102 may be damaged because there is no room as much as thermally expanded portion.

Further, the second holding unit 201, the second cooling mechanism 202, the fourth heating mechanism 203 and the spacer 204 are not completely fixed to each other for the same reason, and are laminated with a predetermined room in a horizontal direction. Particularly, the second holding unit 201, the second cooling mechanism 202, the fourth heating mechanism 203 and the spacer 204 are centered to some extent by the positioning pins, respectively, and are in a state where the rotation thereof is restricted to some extent by detent pins 12.

As such, the first holding unit 101 and the second holding unit 201 are not completely fixed and is laminated with a predetermined room in a horizontal direction with respect to other adjacent members (herein, the cooling mechanism 102 and the second cooling mechanism 202). Therefore, horizontal misalignment is likely to occur in the first holding unit 101 and the second holding unit 201. Particularly, in a case where the boding processing is performed under a reduced pressure environment, misalignment of the first holding unit 101 and the second holding unit 201 is likely to occur during the procedure decompressing the inside of the chamber 501 (to be described below) by intake.

Thus, if misalignment occurs in the first holding unit 101 and the second holding unit 201, the target substrate W and the glass substrate S may be bonded in a misaligned state.

Therefore, in the bonding unit 90 according to the present exemplary embodiment, the first holding unit 101 and the second holding unit 201 are elastically held by the first holding mechanism 401 and the second holding mechanism 402, respectively. Accordingly, it is possible to suppress misalignment of the first holding unit 101 and the second holding unit 201 while tolerating the thermal expansion due to heating.

The first holding mechanism 401 is disposed between the first holding unit 101 and the first chamber portion 511 (to be described below) to elastically hold the outer periphery of the first holding unit 101. Further, the second holding mechanism 402 is disposed between the second holding unit 201 and the second chamber portion 512 (to be described below) to elastically hold the outer periphery of the first holding unit 201.

Figure 7:
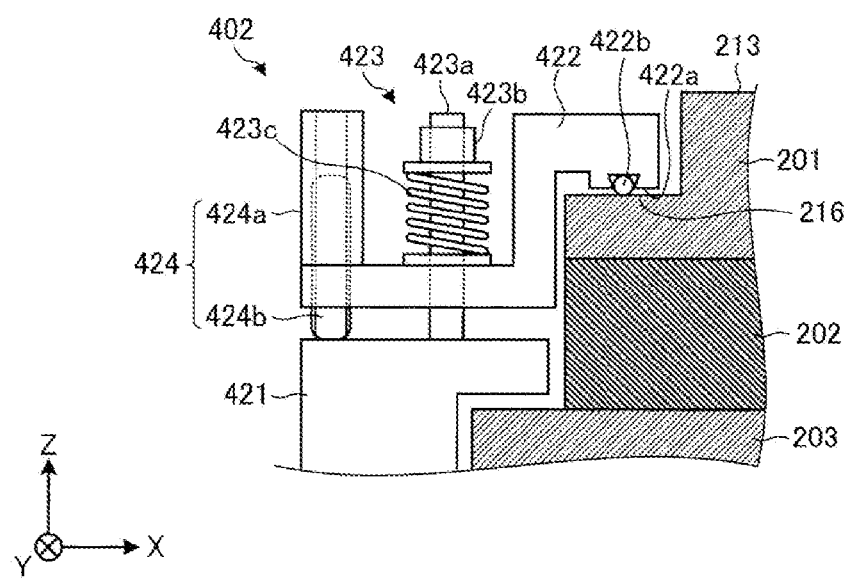
FIG. 7 is a schematic cross-sectional side view illustrating a second holding mechanism.
Figure 8:
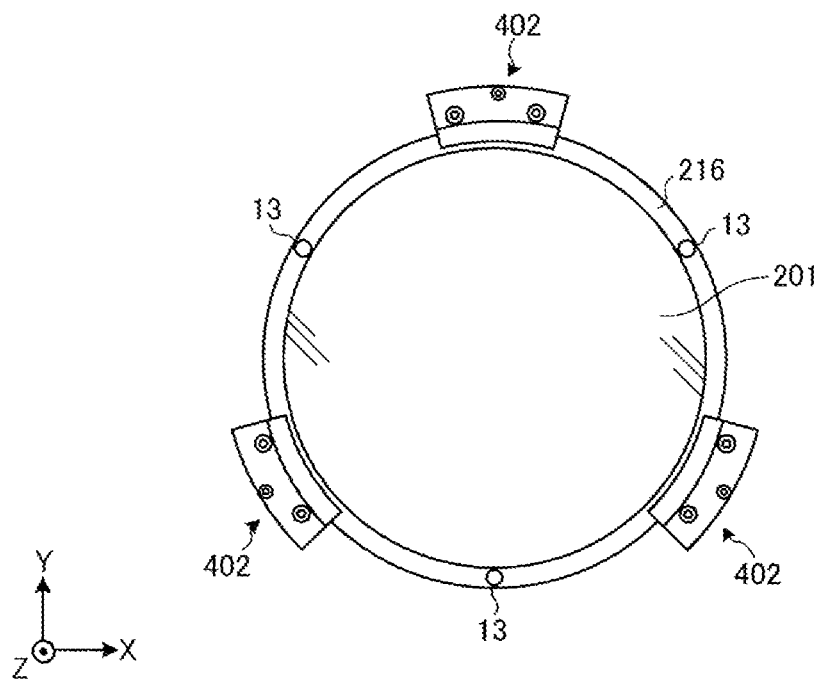
FIG. 8 is a schematic cross-sectional plan view illustrating an exemplary arrangement of the second holding mechanism.

Here, the entire configuration of the second holding mechanism 402 will be described with reference to FIGS. 7 and 8. FIG. 7 is a schematic cross-sectional side view of the second holding mechanism 402. Further, FIG. 8 is a schematic cross-sectional plan view illustrating an example of arrangement of the second holding mechanism 402.

As illustrated in FIG. 7, the second holding mechanism 402 is provided with a base 421, a claw 422, a vertically biasing portion 423 and a support 424.

The base 421 is formed substantially in an arc shape when viewed from the top and disposed adjacent to an outer periphery of the fourth heating mechanism 203. The lower end of the base 421 is fixed to, for example, the bottom surface of the second chamber portion 512.

The claw 422 is a member formed in a substantially toenail-like shape when viewed from the side. The base end of the claw 422 is disposed at a predetermined interval on the top of the base 421, and the front end is disposed on the top of a step 216 of the second holding unit 201.

The claw 422 is provided with a coil spring 422b on a facing surface 422a to the step 216 of the second holding unit 201. The coil spring 422b is installed transversely on the facing surface 422a in a state of being curved along the circumferential direction of the step 216.

The vertically biasing portion 423 biases the claw 422 in the Z-axis negative direction. Particularly, the vertically biasing portion 423 is provided with a shaft 423a, a locking portion 423b and a vertically biasing member 423c. The shaft 423a is a member that extends in the Z-axis direction. The shaft 423a is provided so as to penetrate the base end of the claw 422, and the base end of the shaft 423a is fixed to the base 421. The shaft 423a is formed with a screw groove.

The locking portion 423b is attached to the shaft 423a. The locking portion 423b includes, for example, a nut, and is capable of adjusting the position in the Z-axis direction by turning it along the screw groove formed on the shaft 423a.

The vertically biasing member 423c is provided between the top surface of the base end of the claw 422 and the locking portion 423b, and biases the claw 422 in the Z-axis negative direction.

The support 424 is a member configured to maintain the horizontality of the claw 422, and constituted with, for example, a nut 424a and a headless bolt 424b. The support 424 may adjust the horizontality of the claw 422 by tightening or loosening the nut 424a to the headless bolt 424b.

The second holding mechanism 402 is configured as described above, and as the claw 422 is biased in the Z-axis negative direction by the vertically biasing portion 423, the claw 422 biases the second holding unit 201 in the Z-axis negative direction. As a result, the second holding unit 201 is elastically held.

As described above, in the bonding unit 90, the second holding mechanism is used to elastically hold the outer periphery of the second holding unit 201. Accordingly, in a case where the second holding unit 201 is not fixed in consideration of thermal expansion, it is possible to suppress misalignment of the second holding unit 201 while tolerating the thermal expansion of the second holding unit 201 due to heating.

Further, since the claw 422 of the second holding mechanism 402 is provided with the coil spring 422b on the facing surface 422a with respect to the step 216 of the second holding unit 201, it is possible to more elastically hold the second holding unit 201 in a less contact area. As a result, it is possible to suppress, for example, the contact site of the second holding unit 201 with the second holding mechanism 402 from being damaged.

Further, in the bonding unit 90, the bonding processing of the target substrate W and the glass substrate S is performed under a high-temperature environment higher than the heat-resistant temperature of a fluorine rubber known for its high heat-resistance. For this reason, a metal coil spring 422b may be suitable for the member installed on the facing surface 422a of the claw 422 with respect to the step 422a.

Further, the second holding mechanism 402 is configured such that the claw 422 abuts onto the step 216 of the second holding unit 201, and is formed at a height to the extent that the second holding mechanism 402 does not protrude out of the holding surface 213 of the second holding unit 201. Accordingly, even when the first holding unit 101 and the second holding unit 201 approach each other during the bonding processing to be described below, the second holding mechanism 402 does not interfere.

The second holding mechanism 402 is provided in plural numbers for the outer periphery of the second holding unit 201. For example, as illustrated in FIG. 8, the step 216 of the second holding unit 201 is provided with three second holding mechanisms 402 arranged at even intervals in the circumferential direction of the second holding unit 201. As a result, it is possible to more evenly tolerate the thermal expansion of the second holding unit 201 due to heating.

Further, the step 216 of the second holding unit 201 is further provided with a bolt 13 in order to prevent rotation of the second holding unit 201, the second cooling mechanism 202, the fourth heating mechanism 203 and the spacer 204.

Although a case where the second holding unit 201 is provided with three second holding mechanisms 402 is exemplified herein, the number of the second holding mechanisms 402 provided in the second holding unit 201 is not limited to three.

As illustrated in FIG. 4, the first holding mechanism 401 also elastically hold the first holding unit 101 in the same manner as the second holding mechanism 402 as described above. As illustrated in FIG. 4, the first holding mechanism 401 is provided with a claw 411 and a vertically biasing member 412. The front end of the claw 411 abuts onto the step 116 of the first holding unit 101, and the vertically biasing member 412 biases the claw 411 in the Z-axis positive direction. As a result, similarly to the second holding unit 201, the first holding unit 101 is elastically held. Further, similarly to the claw 422 of the second holding mechanism 402, the claw 411 is provided with a coil spring (not illustrated) on the facing surface with respect to the step of the first holding unit 101. Further, the first holding mechanism 401 is provided in plural numbers for the outer periphery of the first holding unit 201 in the same manner as the second holding mechanism 402.

Figure 9:
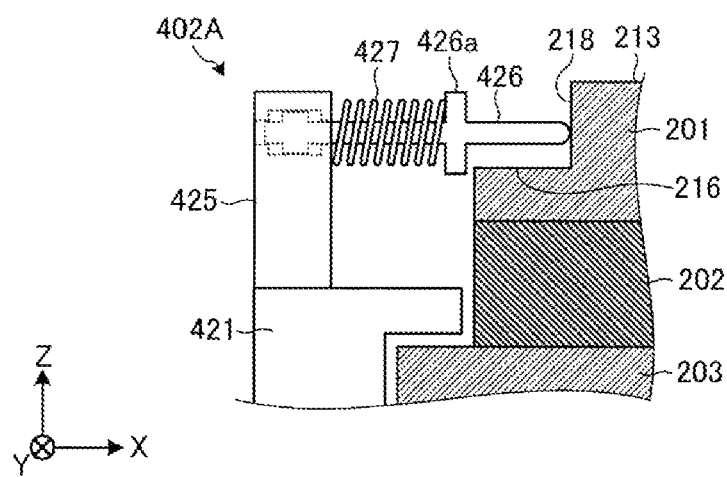
FIG. 9 is a schematic side view illustrating a second holding mechanism according to a modified embodiment.

However, each of the first holding mechanism 401 and the second holding mechanism 402 may be further provided with a horizontally biasing member configured bias the first holding unit 101 or the second holding unit 201 in the horizontal direction with respect to the holding surfaces 113, 213. In this connection, description will be made on a case where the second holding mechanism is provided with a horizontally biasing member with reference to FIG. 9. FIG. 9 is a schematic side view illustrating a second holding mechanism according to a modified embodiment.

As illustrated in FIG. 9, a second holding mechanism 402A according to the modified embodiment is provided with a support 425, a holding pin 426 and a horizontally biasing member 427. The support 425 is a member that extends in the Z-axis direction, and is fixed to the top surface of a base 421 at its base end.

The holding pin 426 is a rod-like member that extends horizontally (here, the X-axis direction), and is supported at its base end to be movable forwardly and rearwardly in the support 425. The front end of the holding pin 426 abuts onto a sidewall 218 connecting to the holding surface 213 of the second holding unit 201 and the step 216. Further, a locking portion 426a having a diameter larger than that of the holding pin 426 is formed in the middle of the holding pin 426.

The horizontally biasing member 427 is provided between the locking portion 426a of the holding pin 426 and the support 425, and biases the holding pin 426 horizontally (here, the X-axis positive direction). As a result, the second holding unit 201 is biased horizontally forward the center.

As such, since the second holding mechanism 402A is further provided with the horizontally biasing member 427, it is possible to more securely suppress misalignment of the second holding unit.

Although a case is described herein where the second holding mechanism 402A is provided with both of the vertically biasing member 423c and the horizontally biasing member 427, the second holding mechanism 402A may not be provided with the vertically biasing member 423c.

Figure 10A:
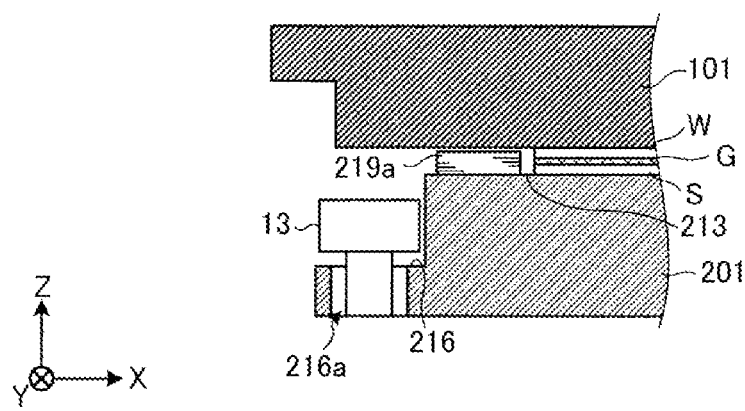
FIG. 10A is a view illustrating a modified embodiment in a case where a stopper is installed to suppress misalignment of the target substrate or the glass substrate.
Figure 10B:
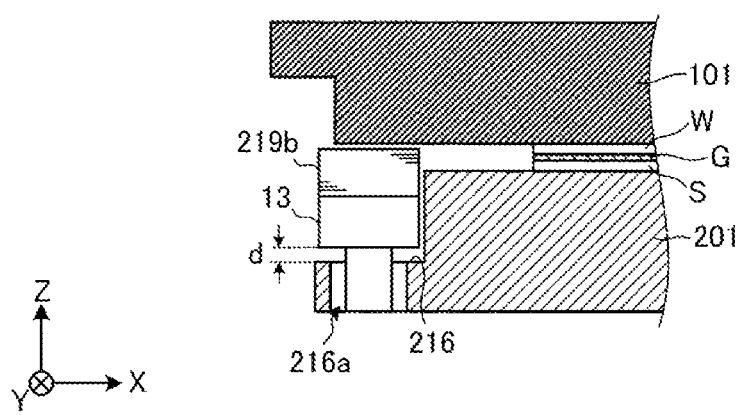
FIG. 10B is a view illustrating a modified embodiment in a case where a stopper is installed to suppress misalignment of the target substrate or the glass substrate.

Further, in the bonding unit 90, a stopper may be provided in the outer periphery of the first holding unit 101 or the second holding unit 201 in order to suppress considerable misalignment of the target substrate W or the glass substrate S. In this connection, description will be made with reference to FIGS. 10A and 10B. FIGS. 10A and 10B are views illustrating a modified embodiment in a case where a stopper is installed to suppress misalignment of the target substrate or the glass substrate.

As illustrated in FIG. 10A, a stopper 219a for suppressing misalignment is provided in, for example, the outer periphery of the holding surface 13 of the second holding unit 201. Accordingly, for example, even if misalignment occurs as the target substrate W or the glass substrate, considerable alignment may be suppressed by abutting onto the stopper 219a. Further, the stopper 219a may be thicker than the glass substrate S and thinner than the total thickness of the target substrate W, the glass substrate S and the adhesive G.

Further, as illustrated in FIG. 10B, a stopper 219b may be provided on the top of the bolt 13 provided on the step 216 of the second holding unit 201. Similarly to the case illustrated in F10A, in this case, considerable alignment of the target substrate W or the glass substrate S may also be suppressed as the target substrate W or the glass substrate S, which causes misalignment, abuts onto the stopper 219b.

Further, as illustrated in FIG. 10B, the bolt 13 is provided such that its head is spaced at a predetermined distance d from the top surface of the step 216. Therefore, when the second holding unit 201, the second cooling mechanism 202, the fourth heating mechanism 203 and the spacer 204 thermally expand vertically due to heating, the second holding unit 201 may be suppressed from being damaged. Further, an insertion through-hole 216a for the bolt 13 may be formed in an oval shape which is long in a radial direction of the second holding unit 201, instead of a perfect circular shape. Therefore, when the second holding unit 201 thermally expands horizontally due to heating, the second holding unit 201 may be suppressed from being damaged.

Referring back to FIG. 4, descriptions of the bonding unit 90 will be continued. Each of the second holding unit 201, the second cooling mechanism 202, the fourth heating mechanism 203, the spacer 204, the second chamber portion 512 and the respective positioning pins 11 is formed with a through-hole that penetrates vertically. And, as the second holding unit 201, the second cooling mechanism 202, the fourth heating mechanism 203, the spacer 204, the second chamber portion 512 and the respective positioning pins 11 are laminated, a through-hole 205 that penetrates from the bottom surface of the second chamber portion 512 to the top surface of the second holding unit 201 is formed. The first temperature detection unit 301 configured to detect a temperature of the glass substrate S is inserted through the through-hole 205.

Further, the bonding unit 90 is provided with a chamber 501, movement mechanisms 502, a decompression mechanism 503, a first image capturing unit 504 and a second image capturing unit 505.

The chamber 501 is a processing container of which the inside is sealable, and is provided with the first chamber portion 511 and the second chamber portion 512. The first chamber portion 511 is a bottomed cylindrical container of which the lower part is opened, and accommodates the first holding unit 101, the first cooling mechanism 102, the third heating mechanism 103, the pressing units 104, the pressure vessel 161, the second temperature detection unit 302 and the first holding mechanisms 401 therein. In addition, the second chamber portion 512 is a bottomed cylindrical container of which the upper part is opened, and accommodates the second holding unit 201, the second cooling mechanism 202, the fourth heating mechanism 203, the spacer 204 and the second holding mechanism 402 therein.

The first chamber portion 511 is configured to be movable up and down vertically by an elevation mechanism (not illustrated) such as an air cylinder. As the first chamber portion 511 is moved down by such an elevation mechanism to abut onto the second chamber portion 512, a closed space is formed inside the chamber 501. Further, on the abutting surface of the first chamber portion 511 onto the second chamber portion 512, a seal member 513 is provided so as to secure a sealability of the chamber 501. The seal member 513 may be, for example, an O-ring.

The movement mechanisms 502 are provided in the outer periphery of the first chamber portion 511, and move the first holding unit 101 horizontally through the first chamber portion 511. A plurality of (e.g., five) movement mechanisms 502 are provided in the outer periphery of the first chamber portion 511. Four of five movement mechanisms 502 are used for horizontal movement of the first holding unit 101, and the remaining one is used for rotation of the first holding unit 101 around the vertical axis.

Each of the movement mechanisms 502 is provided with a cam 521 configured to abut onto the outer periphery of the first chamber portion 511 and move the first holding unit 101, and a rotation driving unit 523 configured to rotate the cam 521 through a shaft 522. The cam 521 is provided eccentrically with respect to the central axis of the shaft 522. And, when the cam 521 is rotated by the rotation driving unit 523, the central position of the cam 521 may move to allow the first holding unit 101 to move horizontally.

The decompression mechanism 503 is provided in, for example, the lower portion of the second chamber portion 512, and decompresses inside the chamber 501. The decompression mechanism 503 is provided with an intake pipe 531 configured to intake an atmosphere inside the chamber 501, and an intake device 532, such as a vacuum pump, connected to the intake pipe 531.

The first image capturing unit 504 is disposed below the first holding unit 101 to capture the surface image of the target substrate W held in the first holding unit 101. Further, the second image capturing unit 505 is disposed above the second holding unit 201 to capture the surface image of the glass surface S held in the second holding unit 201.

The first image capturing unit 504 and the second image capturing unit 505 are configured to be movable horizontally by a movement mechanism (not illustrated), and capture images of the target substrate W and the glass substrate S by entering the chamber 201 before the first chamber portion 511 moves down. The image data of the first image capturing unit 504 and the second image capturing unit 505 are transmitted to the control device 5. Further, each of the first image capturing unit 504 and the second image capturing unit 505 may be, for example, a wide-angle type CCD camera.

<4. Operations of Bonding Unit>

Figure 11A:
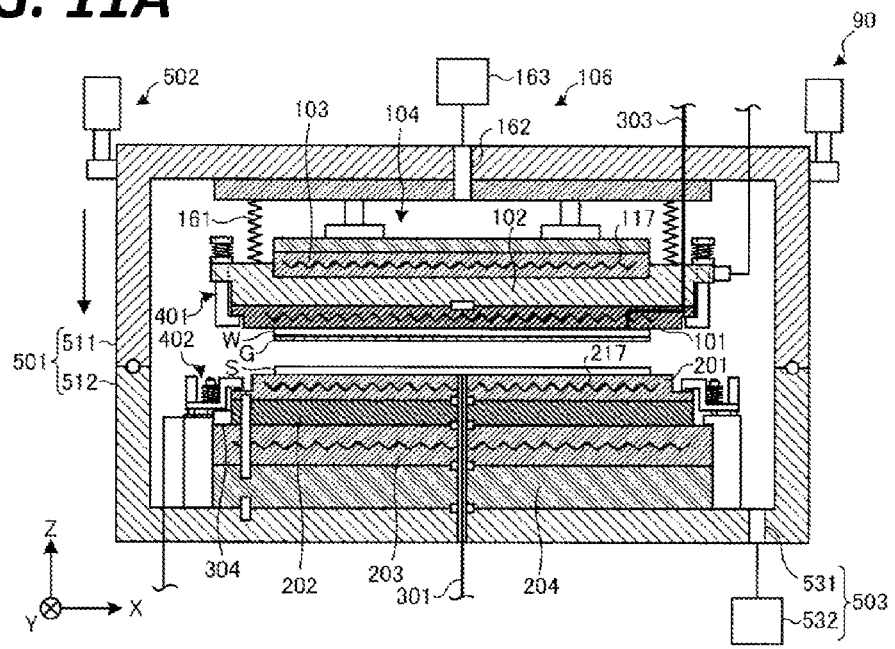
FIG. 11A is a view for describing an operation example of a bonding processing.
Figure 11B:
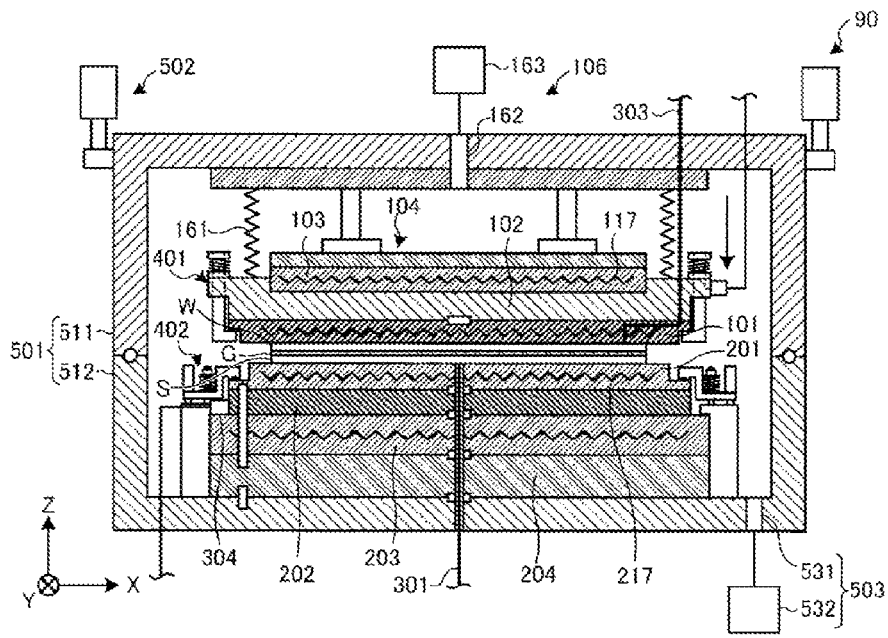
FIG. 11B is a view for describing an operation example of a bonding processing.

Referring to FIGS. 11A and 11B, descriptions will be made on the processing sequence of the bonding processing performed by the bonding unit 90 configured as described above. FIGS. 11A and 11B are views for describing an operation example of the bonding processing.

In the bonding unit 90, the target substrate W is held first by the first holding unit 101, and the glass substrate S is held by the second holding unit 201. At this time, the first holding unit 101 and the second holding unit 201 are heated to a first temperature in advance by the first heating mechanism 117 of the first holding unit 101 and the second heating mechanism 217 of the second holding unit 201, respectively. The first temperature is, for example, 200° C. or lower.

Further, at this time, the third heating mechanism 103 and the fourth heating mechanism 203 also perform heating to the same first temperature as in the first heating mechanism 117 and the second heating mechanism 217. Therefore, the first cooling mechanism 102 and the second cooling mechanism 202 are suppressed from being warped, and thus, the first holding unit 101 and the second holding unit 201 are prevented from being damaged.

Subsequently, in the bonding unit 90, an alignment processing is performed. In the alignment processing, the first image capturing unit 504 and the second image capturing unit 505 as illustrated in FIG. 4 move horizontally to enter the chamber 501, and capture images of the surfaces of the target substrate W and the glass substrate S, respectively.

Thereafter, the horizontal position of the target substrate W is adjusted by the movement mechanisms 502 so that the position of the reference point of the target substrate W displayed in the image captured by the first image capturing unit 504 accords with the position of the reference point of the glass substrate S displayed in the image captured by the second image capturing unit 505. Therefore, the horizontal position of the target substrate W with respect to the glass substrate S is adjusted.

Subsequently, after the first image capturing unit 504 and the second image capturing unit 505 retreat from the chamber 501, the first chamber 511 moves down by movement mechanisms (not illustrated). Then, as the first chamber portion 511 abuts onto the second chamber portion 512, a sealed space is formed in the chamber 501 (see FIG. 11A).

Subsequently, the decompression processing is performed in the bonding unit 90. In the decompression processing, the atmosphere in the chamber 501 is sucked by the decompression mechanism 503 such that the inside of the chamber 501 is decompressed. As described above, since the first holding unit 101 and the second holding unit 201 are elastically held by the first holding mechanisms 401 and the second holding mechanisms 402, misalignment does not occur during the decompression processing.

Thereafter, a temperature increasing processing is performed in the bonding unit 90. In the temperature increasing processing, the target substrate W and the glass substrate S are heated by the first heating mechanism 117 of the first holding unit 101 and the second heating mechanism 217 of the second holding unit 201. In such a temperature increasing processing, the target substrate W and the glass substrate S are heated from the first temperature to a second temperature. The second temperature is, for example, 300° C. or higher.

At this time, the third heating mechanism 103 and the fourth heating mechanism 203 also heat the target substrate W and the glass substrate S to the second temperature at the same heating rate as in the first heating mechanism 117 and the second heating mechanism 217. Accordingly, the first cooling mechanism 12 and the second cooling mechanism are suppressed from being warped, and thus, the first holding unit 101 and the second holding unit 201 are prevented from being damaged.

Subsequently, a main bonding processing is performed in the bonding unit 90. In the main bonding processing, the pressure vessel 161 is pressurized to a predetermined pressure by supplying gas to the pressure vessel 161. Accordingly, the first holding unit 101 moves down such that the target substrate W and the glass substrate S are pressed at a predetermined pressure (see FIG. 11B). The adhesive G applied onto the bonding surface Wj of the target substrate W is softened by the heating to the second temperature, and the target substrate W is pressed to the glass substrate S at a predetermined pressure such that the target substrate W and the glass substrate S are bonded to each other.

Further, by decompressing the atmosphere in the chamber 501, it is possible to suppress voids from occurring between the target substrate W and the glass substrate S.

Subsequently, a temperature decreasing processing is performed in the bonding unit 90. In the temperature decreasing processing, the target substrate W and the glass substrate S are cooled to the first temperature while maintaining the state where the target substrate W and the glass substrate S are pressed by the pressing mechanism 106. As a result, the softened adhesive G is hardened such that the target substrate W and the glass substrate S are bonded to each other.

After the first chamber portion 511 moves up by movement mechanisms (not illustrated), the superposed substrate T thus formed is carried out from the bonding unit 90 by the transfer unit 80, and transferred to the cassette Ct in the above-mentioned order.

<5. Temporary Bonding Processing>

In the bonding system 1 according to the present exemplary embodiment, a glass substrate S is used as a support substrate, and an electrostatic chuck is used as a second holding unit 201 that holds the glass substrate S. Further, in the bonding system 1 according to the present exemplary embodiment, the temperature increasing processing in which the temperature in the chamber 501 is increased from the first temperature to the second temperature, is performed as described above.

In order to electrostatically adsorb the glass substrate S, a high voltage is applied to the second holding unit 201. Further, the second temperature is a temperature higher than the glass transition temperature of the glass substrate S. Accordingly, if the glass substrate is heated to the second temperature in a state of being electrostatically adsorbed by using the second holding unit 201 as an electrostatic chuck, sodium may be precipitated as sodium ions in the glass substrate S migrate to the contact surface with the second holding unit 201.

If sodium is precipitated, problems such as surface deterioration of the second holding unit 201 or deformation of the glass substrate S may occur. It may be considered that the electrostatic adsorption of the glass substrate S by the second holding unit 201 is released in the temperature increasing processing. However, misalignment of the glass substrate S may occur in such a case.

Therefore, in the bonding system 1 according to the present exemplary embodiment, the target substrate W and the glass substrate S are held by the first holding unit 101 and the second holding unit 201, respectively, and then, a temporary bonding processing is performed to temporarily bond the target substrate W and the glass substrate S at a temporary pressure and temperature lower than those in the main bonding processing. Then, after the electrostatic adsorption by the second holding unit 201 is released, the temperature increasing processing is performed.

Figure 12:
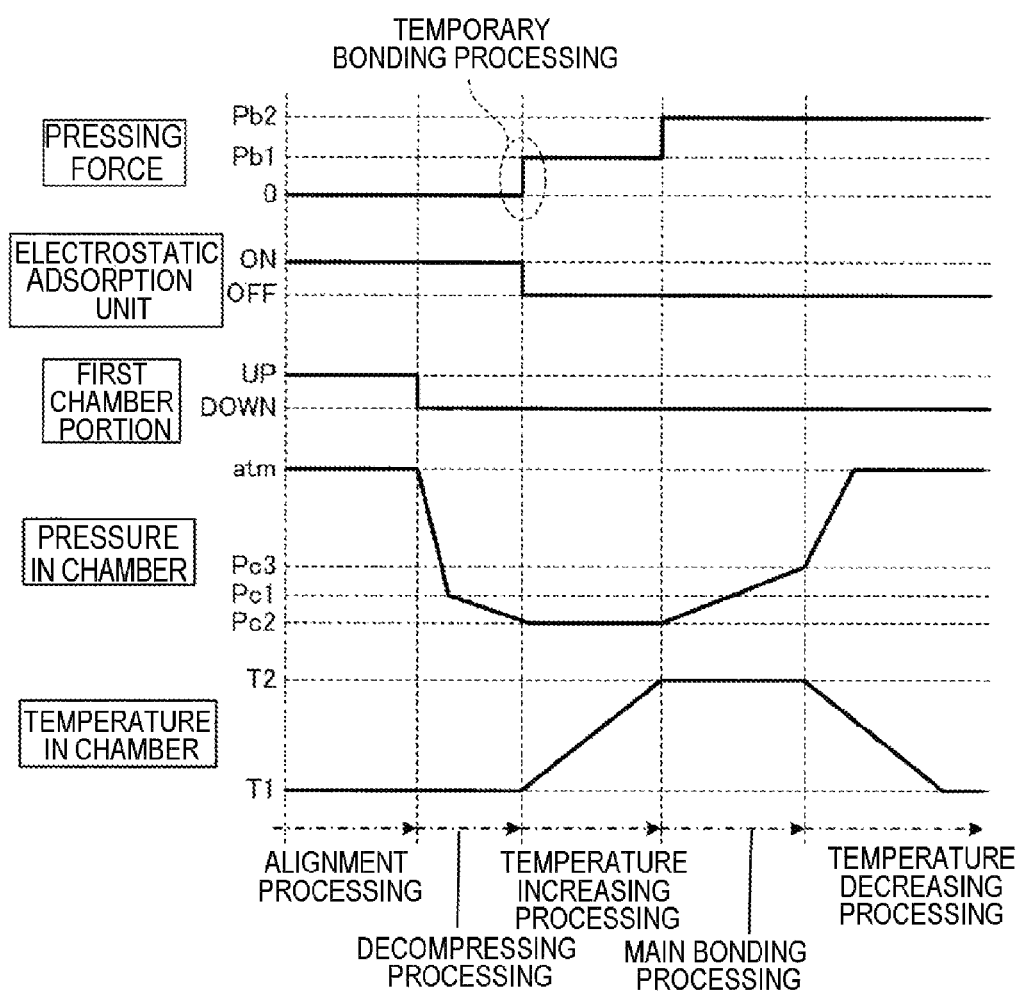
FIG. 12 is a timing chart illustrating a processing sequence of the bonding processing according to the present exemplary embodiment.

The temporary bonding processing will be described in detail with reference to FIG. 12. FIG. 12 is a timing chart illustrating a processing sequence of the bonding processing according to the present exemplary embodiment.

As illustrated in FIG. 12, in the bonding unit 90, after the alignment processing is terminated, the first chamber portion 511 moves down, and the decompression processing is performed. In the decompression processing, the pressure in the chamber 501 is decreased from the atmospheric pressure atm to a predetermined pressure Pc2. Particularly, the pressure in the chamber 501 is decreased from the atmospheric pressure atm to a pressure Pc1, and then, to the predetermined pressure Pc2 by changing the intake device 532 (see FIG. 4) to another intake device having a stronger intake force than that of the intake device 532.

Thereafter, the temporary bonding processing is performed. In the temporary bonding processing, the target substrate W is brought into contact with the glass substrate S by moving down the first holding unit 101 using the pressing mechanism 106, and both of the substrate are pressed with a pressing force Pb1 lower than a pressing force Pb1 in the main bonding.

At this time, the electrostatic adsorption units 111, 211 of the first holding unit 101 and the second holding unit 201 are in a state of ON, but the temperature in the chamber 501 is a first temperature T1 not higher than the glass transition temperature of the glass substrate S. Therefore, there is no concern that sodium may be precipitated from the glass substrate S.

Further, the pressing force Pb1 in the temporary bonding processing is, for example, the same pressure as the atmospheric pressure. Since the inside of the chamber 501 has been decompressed, the target substrate W and the glass substrate S are in a state of being pressed even at the atmospheric pressure.

After the temporary bonding processing is terminated, the electrostatic adsorption by the electrostatic adsorption units 111, 211 is released in the bonding unit 90, and the target substrate W and the glass substrate S start to be heated from the first temperature T1 to a second temperature T2 in a state of being pressed with the pressing force Pb1. After reaching the second temperature T2, in the bonding unit 90, the main bonding is performed on the target substrate W and the glass substrate S using the pressing mechanism 106 with the predetermined pressing force Pb2.

As described above, in the bonding system 1 according to the present exemplary embodiment, since the electrostatic adsorption by the electrostatic adsorption units 111, 211 is released before starting to heat, there is no concern that sodium may be precipitated in the subsequent temperature increasing processing, bonding processing and temperature decreasing processing. Further, even though the electrostatic adsorption by the electrostatic adsorption units 111, 211 is released, since the target substrate W and the glass substrate S is temporarily bonded, there is no concern that misalignment of the target substrate W and the glass substrate S may occur.

According to the bonding system 1 of the present exemplary embodiment, it is possible to suppress sodium precipitation from the glass substrate S while suppressing misalignment of the target substrate W and the glass substrate S.

Here, the electrostatic adsorption by the electrostatic adsorption units 111, 211 was released after the target substrate W and the glass substrate S were temporarily bonded. However, the timing of releasing the electrostatic adsorption may be simultaneous with the temporary bonding processing. That is, the bonding unit 90 may release the electrostatic adsorption by the electrostatic adsorption units 111, 211 at the timing when the target substrate W and the glass substrate S come into contact with each other in the temporary bonding processing. Accordingly, it is possible to release the electrostatic adsorption in an earlier stage while suppressing misalignment of the target substrate W and the glass substrate S.

Further, here, the heating to the second temperature T2 starts after the electrostatic adsorption by the electrostatic adsorption units 111, 211 is released. However, the timing of starting heating to the second temperature T2 may be simultaneous with or earlier than the release of the electrostatic adsorption. That is, the electrostatic adsorption by the electrostatic adsorption units 111, 211 may be released at least before exceeding the glass transition temperature of the glass substrate S.

Further, here, the target substrate W and the glass substrate S are electrostatically adsorbed by the electrostatic adsorption units 111, 211 during the alignment processing and the decompression processing. However, if the target substrate W and the glass substrate S are electrostatically adsorbed under the atmospheric environment and then decompression is performed to a predetermined pressure, discharge may be generated during the decompression (Paschen's law), and thus, the target substrate W and the glass substrate S may be damaged.

Therefore, the bonding unit 90 may adsorb and hold the target substrate W and the glass substrate S using the vacuum adsorption units 112, 212 in the alignment processing, and then, after the decompression has progressed to some extent in the decompression processing, change the adsorption to the electrostatic adsorption by the electrostatic adsorption units 111, 211. As s result, the target substrate W and the glass substrate S may be suppressed from being damaged by discharge.

In the main bonding processing, the state of pressing the target substrate W and the glass substrate S with the predetermined pressing force Pb2 at the second temperature T2 is maintained for a predetermined time. Further, in the main bonding processing, the pressure in the chamber 501 is changed from Pc2 to Pc3.

Thereafter, in the bonding unit 90, the temperature in the chamber 501 is decreased from the second temperature T2 to the first temperature T1 using the first cooling mechanism 102 and the second cooling mechanism 202. At this time, by decreasing the temperature while pressing the target substrate W and the glass substrate S with the predetermined pressing force Pb2, the superposed substrate T may be suppressed from being warped. Further, in the temperature decreasing processing, the pressure in the chamber 501 is returned from Pc3 to the atmospheric pressure atm. Then, the superposed substrate T is carried out from the bonding unit 90, and a series of bonding processings are terminated.

<6. Fail-Safe Processing>

Figure 13:
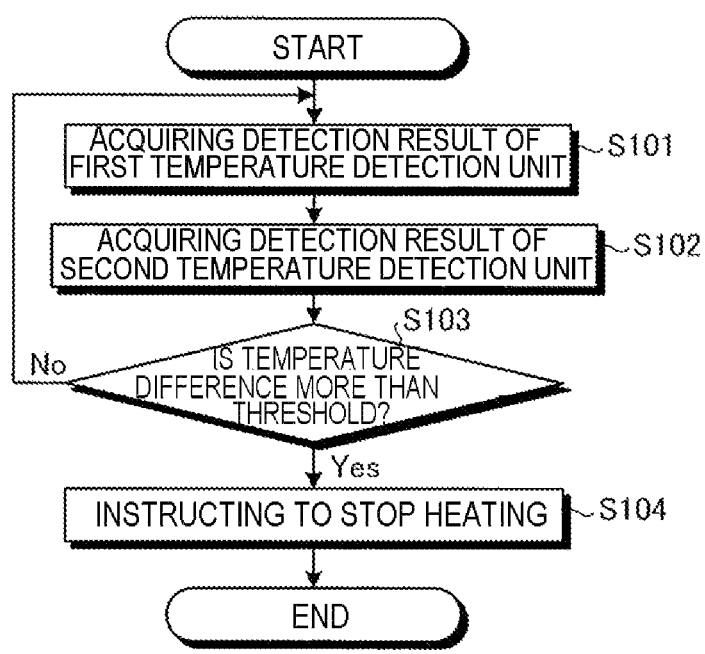
FIG. 13 is a flowchart illustrating a processing sequence of a fail-safe processing.

Descriptions will be made on the processing sequence of a fail-safe processing using the first temperature detection units 301, 303 and the second temperature detection units 302, 304 with reference to FIG. 13. FIG. 13 is a flowchart illustrating a processing sequence of the fail-safe processing. Further, the fail-safe processing as illustrated in FIG. 13 is performed, for example, during the temperature increasing processing and the main bonding processing as described above.

Here, descriptions will be made on a case of detecting warpage of the first cooling mechanism 102 using the first temperature detection unit 303 and the second temperature detection unit 302. The processing of detecting warpage of the second cooling mechanism 202 using the first temperature detection unit 301 and the second temperature detection units 304 is performed in the same processing sequence as and in parallel with the first cooling mechanism 102 as described below.

As illustrated in FIG. 13, the control device 5 acquires a detection result of the first temperature detection unit 303, that is, the temperature of the target substrate W (step S101), and acquires a detection result of the second temperature detection unit 302, that is, the temperature of the outer periphery of the first cooling mechanism 102 (step S102). Subsequently, the control device 5 determines whether the temperature difference between the target substrate W and the outer periphery of the first cooling mechanism 102 is more than the threshold (step S103).

And, when it is determined that the temperature difference is more than the threshold in the processing (step S103, Yes), the control device 5 instructs the bonding unit 90 to stop heating (step S104), and terminates the fail-safe processing. As a result, the bonding unit 90 stops the first heating mechanism 117, the second heating mechanism 217, the third heating mechanism 103 and the fourth heating mechanism 203. Meanwhile, when the temperature difference between the target substrate W and the outer periphery of the first cooling mechanism 102 is not more than the threshold (step S103, No), the control device 5 repeats, for example, the processings of steps S101 to step S103.

By performing such a fail-safe processing, in the bonding system 1 according to the present exemplary embodiment, even if warpage occurs in the first cooling mechanism 102 and the second cooling mechanism 202, further warpage may be suppressed from occurring, and thus, the first holding unit 101 and the second holding unit 201 may be prevented from being damaged.

As described above, the bonding apparatus 45 according to the present exemplary embodiment is provided with a first holding unit 101, a second holding unit 201, a pressing mechanism 106, a first cooling mechanism 102, a second cooling mechanism 202, a third heating mechanism 103 and a fourth heating mechanism 203.

The first holding unit 101 is provided with a first heating mechanism 117 and holds a target substrate W that is a first substrate. The second holding unit 201 is disposed facing the first holding unit 101, is provided with a second heating mechanism 217 and holds a glass substrate S that is a second substrate. The pressing mechanism 106 relatively moves the first holding unit 101 and the second holding unit 201 to contact and press the target substrate W and the glass substrate S. The first cooling mechanism 102 is provided at an opposite side to a holding surface 113 of the first holding unit 101, and cools the target substrate W through the first holding unit 101. The second cooling mechanism 202 is provided at an opposite side to a holding surface 213 of the second holding unit 201, and cools the glass substrate S through the second holding unit 201. The third heating mechanism 103 is provided at a side of the first cooling mechanism 102 opposite to the side on which the first holding unit 101 is disposed, and heats the first cooling mechanism 102. The fourth heating mechanism 203 is provided at a side of the second cooling mechanism 202 opposite to the side on which the second holding unit 201 is disposed, and heats the second cooling mechanism 202.

Therefore, according to the bonding apparatus 45 of the present exemplary embodiment, it is possible to suppress the first holding unit 101 and the second holding unit 201 from being damaged.

Further, the bonding apparatus 45 according to the present exemplary embodiment is provided with a first holding unit 101, a second holding unit 201, a pressing mechanism 106, a first holding mechanism 401 and a second holding mechanism 402. The holding mechanism 401 and the second holding mechanism 402 elastically hold outer peripheries of the first holding unit 101 and the second holding unit 201.

Therefore, according to the bonding apparatus 45 of the present exemplary embodiment, it is possible to suppress the first holding unit 101 and the second holding unit 201 from being misaligned.

Further, the bonding method according to the present exemplary embodiment includes a first holding processing, a second holding processing, a temporary bonding processing, a temperature increasing processing and a main bonding processing. In the first holding processing, a target substrate W is held. In the second holding processing, a glass substrate S is held by an electrostatic adsorption. In the temporary bonding processing, after the first holding processing and the second holding processing, the target substrate W and the glass substrate S are temporarily bonded with a pressing force lower than a predetermined pressing force at a temperature lower than a predetermined temperature. In the temperature increasing processing, at the same time as or after the temporary bonding processing, the electrostatic adsorption of the glass substrate S is released and the temperature is increased to a predetermined temperature. In the main bonding processing, after the temperature increasing processing, the target substrate W and the glass substrate S are subjected to main bonding with the predetermined pressing force.

Therefore, according to the bonding method of the present exemplary embodiment, it is possible to suppress sodium precipitation from the glass substrate S.

In the above-mentioned exemplary embodiment, application of the adhesive G and heat treatment are performed on the target substrate W in the application and heat treatment block G1, and then, the target substrate W and the glass substrate S are bonded in the bonding processing block G2. However, in a case of handling a target substrate W on which an adhesive G is applied in advance, the processing in the application and heat treatment block G1 may be omitted. Further, in such a case, the bonding system 1 is not necessarily provided with the application and the heat treatment block G1.

Further, in the above-mentioned exemplary embodiment, the control device 5 controls the first holding unit 101, the second holding unit 201, the pressing mechanism 106 and the like provided in the bonding apparatus 45. However, the bonding apparatus 45 may be provided with, for example, a control unit configured to control the first holding unit 101, the second holding unit 201, and the pressing mechanism 106.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A bonding method comprising:
holding a target substrate;
holding a glass substrate by electrostatic adsorption;
after the holding of the target substrate and the glass substrate, temporarily bonding the target substrate and the glass substrate with a pressing force lower than a predetermined pressing force at a temperature lower than a predetermined temperature;
while releasing the electrostatic adsorption of the glass substrate at the same time as or after the temporarily bonding, increasing the temperature to the predetermined temperature; and
after the increasing temperature, performing a main bonding of the target substrate and the glass substrate with the predetermined pressing force.

2. The bonding method of claim 1, further comprising:
after the holding of the target substrate and the glass substrate, and before the temporary bonding, decompressing an inside of a chamber accommodating the target substrate and the glass substrate.

3. The bonding method of claim 1, wherein the temperature lower than the predetermined temperature equals to or lower than a glass transition temperature of the glass substrate, and the predetermined temperature equals to or higher than the glass transition temperature.

4. The bonding method of claim 1, further comprising:
cooling the target substrate after the main bonding by a first cooling mechanism provided at an opposite side to a holding surface of a first holding unit holding the target substrate and configured to cool the target substrate through the first holding unit; and
cooling the glass substrate after the main bonding by a second cooling mechanism provided at an opposite side to a holding surface of a second holding unit holding the glass substrate and configured to cool the glass substrate through the second holding unit;
wherein the increasing temperature includes:
heating the target substrate by a first heating mechanism provided in the first holding unit;
heating the glass substrate by a second heating mechanism provided in the second holding unit;
heating the first cooling mechanism by a third heating mechanism provided on a surface of the first cooling mechanism opposite to the surface on which the first holding unit is disposed and configured to heat the first cooling mechanism; and
heating the second cooling mechanism by a fourth heating mechanism provided on a surface of the second cooling mechanism opposite to the surface on which the second holding unit is disposed and configured to heat the second cooling mechanism.

5. The bonding method of claim 4, further comprising:
detecting the temperature of the target substrate or the glass substrate in the temperature increasing;
detecting the first cooling mechanism or the second cooling mechanism in the temperature increasing; and
if a difference between the temperature of the target substrate or the glass substrate and the temperature of the first cooling mechanism or the second cooling mechanism is more than a threshold, stopping heating by the first heating mechanism, the second heating mechanism, the third heating mechanism and the fourth heating mechanism.

6. A bonding apparatus comprising:
a first holding unit provided with a first heating mechanism and configured to hold a target substrate;
a second holding unit disposed facing the first holding unit, provided with a second heating mechanism and configured to hold a glass substrate;
a pressing mechanism configured to relatively move the first holding unit and the second holding unit in order to contact and press the target substrate and the glass substrate; and
a control unit configured to control the first holding unit, the second holding unit and the pressing mechanism,
wherein the control unit is programmed to temporarily bond the target substrate and the glass substrate at a pressure lower than a predetermined pressure and a temperature lower than a predetermined temperature; release electrostatic adsorption of the glass substrate at the same time as or after the temporary bonding; after increasing the temperature to the predetermined temperature, perform a main bonding of the target substrate and the glass substrate at the predetermined pressure.

7. The bonding apparatus of claim 6, further comprising:
a first cooling mechanism provided at an opposite side to a holding surface of the first holding unit and configured to cool the target substrate through the first holding unit;
a second cooling mechanism provided at an opposite side to a holding surface of the second holding unit and configured to cool the glass substrate through the second holding unit;
a third heating mechanism provided on a surface of the first cooling mechanism opposite to the surface on which the first holding unit is disposed and configured to heat the first cooling mechanism; and
a fourth heating mechanism provided on a surface of the second cooling mechanism opposite to the surface on which the second holding unit is disposed and configured to heat the second cooling mechanism.

8. The bonding apparatus of claim 6, further comprising:
a chamber configured to accommodate the first holding unit and the second holding unit; and
a decompression mechanism configured to decompress the chamber.

9. The bonding apparatus of claim 6, wherein the pressing mechanism adjusts a pressing force of the target substrate and the glass substrate by adjusting a pressure of a gas.

10. The bonding apparatus of claim 6, further comprising:
a first temperature detection unit provided at the first holding unit and configured to detect a temperature of the target substrate; and a second temperature detection unit attached to and outer periphery of the first cooling mechanism and configured to detect a temperature of the first cooling mechanism, wherein the control unit executes a fail-safe processing which stops heating by the first heating mechanism, when the control unit determines that warpage occurs in the first cooling mechanism based on a detection result of the first temperature detection unit and the second temperature detection unit.

11. A bonding system comprising:
a carry-in/out station configured to place a target substrate and a glass substrate;
a substrate transfer apparatus configured to transfer the target substrate and the glass substrate placed in the carry-in/out station;
a bonding station provided with a bonding apparatus configured to bond the first substrate and the second substrate transferred by the substrate transfer apparatus; and
a control unit configured to control the bonding apparatus, wherein the bonding apparatus includes:
   a first holding unit provided with a first heating mechanism and configured to hold a first substrate;
   a second holding unit disposed facing the first holding unit, provided with a second heating mechanism and configured to hold a second substrate; and
   a pressing mechanism configured to relatively move the first holding unit and the second holding unit in order to contact and press the first substrate and the second substrate, and
   the control unit is programmed to temporarily bond the target substrate and the glass substrate at a pressure lower than a predetermined pressure and a temperature lower than a predetermined temperature; release electrostatic adsorption of the glass substrate at the same time as or after the temporary bonding; after increasing the temperature to the predetermined temperature, perform a main bonding of the target substrate and the glass substrate at the predetermined pressure.

12. The bonding system of claim 11, wherein the pressing mechanism adjusts a pressing force of the target substrate and the glass substrate by adjusting pressure of gas.

13. The bonding system of claim 11, further comprising:
a first temperature detection unit provided at the first holding unit and configured to detect a temperature of the target substrate; and
a second temperature detection unit attached to and outer periphery of the first cooling mechanism and configured to detect a temperature of the first cooling mechanism, wherein the control unit executes a fail-safe processing which stops heating by the first heating mechanism, when the control unit determines that warpage occurs in the first cooling mechanism based on a detection result of the first temperature detection unit and the second temperature detection unit.

\* \* \* \* \*